(12) United States Patent
Takeuchi

(10) Patent No.: US 8,228,965 B2
(45) Date of Patent: Jul. 24, 2012

(54) SURFACE EMITTING LASER, MANUFACTURING METHOD OF SURFACE EMITTING LASER, SURFACE EMITTING LASER ARRAY, MANUFACTURING METHOD OF SURFACE EMITTING LASER ARRAY, AND OPTICAL APPARATUS INCLUDING SURFACE EMITTING LASER ARRAY

(75) Inventor: Tetsuya Takeuchi, Yokohama (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 13/039,400

(22) Filed: Mar. 3, 2011

(65) Prior Publication Data

US 2011/0150025 A1 Jun. 23, 2011

Related U.S. Application Data

(62) Division of application No. 12/509,632, filed on Jul. 27, 2009, now Pat. No. 7,924,900.

(30) Foreign Application Priority Data

Jul. 31, 2008 (JP) ................................. 2008-199000

(51) Int. Cl.
*H01S 5/00* (2006.01)
(52) U.S. Cl. ............. 372/45.01; 372/43.01; 372/50.124; 372/98; 372/99
(58) Field of Classification Search ............... 372/45.01, 372/50.124, 43.01, 98, 99
See application file for complete search history.

(56) References Cited

U.S. PATENT DOCUMENTS

| | | | | |
|---|---|---|---|---|
| 5,963,576 A * | 10/1999 | Claisse et al. .................... | 372/96 |
| 7,609,745 B2 | 10/2009 | Takeuchi ........................ | 372/99 |
| 7,807,485 B2 | 10/2010 | Uchida et al. .................... | 438/29 |
| 2002/0006143 A1 * | 1/2002 | Nakayama et al. ............. | 372/45 |
| 2005/0286585 A1 * | 12/2005 | Guenter et al. .............. | 372/50.1 |
| 2006/0093006 A1 * | 5/2006 | Jikutani ....................... | 372/50.1 |

(Continued)

FOREIGN PATENT DOCUMENTS

JP 2001-284722 A 10/2001

(Continued)

OTHER PUBLICATIONS

H.J. Unold, et al., "Singlemode output power enhancement of InGaAs VCSELs by reduced spatial hold burning via surface etching," Electronics Letters, vol. 37, No. 9, Apr. 26, 2001.

(Continued)

*Primary Examiner* — Yuanda Zhang
(74) *Attorney, Agent, or Firm* — Fitzpatrick, Cella, Harper & Scinto

(57) ABSTRACT

A surface emitting laser which is configured by laminating on a substrate a lower reflection mirror, an active layer, and an upper reflection mirror, which includes, in a light emitting section of the upper reflection mirror, a structure for controlling reflectance that is configured by a low reflectance region and a concave high reflectance region formed in the central portion of the low reflectance region, and which oscillates at a wavelength of $\lambda$, wherein the upper reflection mirror is configured by a multilayer film reflection mirror based on a laminated structure formed by laminating a plurality of layers, the multilayer film reflection mirror includes a phase adjusting layer which has an optical thickness in the range of $\lambda/8$ to $3\lambda/8$ inclusive in a light emitting peripheral portion on the multilayer film reflection mirror, and an absorption layer causing band-to-band absorption is provided in the phase adjusting layer.

5 Claims, 13 Drawing Sheets

U.S. PATENT DOCUMENTS

| | | |
|---|---|---|
| 2009/0080489 A1 | 3/2009 | Uchida et al. ............ 372/50.124 |
| 2009/0135872 A1 | 5/2009 | Uchida et al. .............. 372/44.01 |
| 2009/0135876 A1 | 5/2009 | Takeuchi et al. ........... 372/50.11 |
| 2009/0213889 A1 | 8/2009 | Takeuchi ................... 372/45.01 |
| 2010/0027576 A1 | 2/2010 | Takeuchi ................... 372/45.01 |

FOREIGN PATENT DOCUMENTS

| | | |
|---|---|---|
| JP | 2007-158153 A | 6/2007 |

OTHER PUBLICATIONS

J.A. Vukusic et al, "Numerical Optimization of the Single Fundamental Mode Output from a Surface Modified Vertical-Cavity Surface-Emitting Laser," IEEE Journal of Quantum Electronics, vol. 37, No. 1, pp. 108-117, Jan. 2001.

* cited by examiner

SURFACE EMITTING LASER, MANUFACTURING METHOD OF SURFACE EMITTING LASER, SURFACE EMITTING LASER ARRAY, MANUFACTURING METHOD OF SURFACE EMITTING LASER ARRAY, AND OPTICAL APPARATUS INCLUDING SURFACE EMITTING LASER ARRAY

CROSS REFERENCE TO RELATED APPLICATION

This application is a division of U.S. application Ser. No. 12/509,632, filed on Jul. 27, 2009, the entire disclosure of which is hereby incorporated by reference herein.

BACKGROUND OF THE INVENTION

1. Field of the Invention

The present invention relates to a surface emitting laser, a manufacturing method of the surface emitting laser, a surface emitting laser array, a manufacturing method of the surface emitting laser array, and an optical apparatus including the surface emitting laser array.

2. Description of the Related Art

As one of the surface emitting lasers, there is known a vertical cavity surface emitting laser (hereinafter referred to as VCSEL).

According to the surface emitting laser of this type, a light beam can be taken out perpendicularly to a semiconductor substrate surface, and hence a two-dimensional array can be easily formed only by changing a mask pattern at the time of forming the laser elements.

The parallel processing using the plurality of beams emitted from the two-dimensional array enables the increase in density and speed, and hence is expected to be applied in various industrial fields.

For example, when the surface emitting laser array is used as an exposure light source of an electrophotographic printer, it is possible to increase the density and speed in the printing process by using the plurality of beams.

In such electrophotographic printing process, it is necessary to form stable and minute laser spots on a photosensitive drum. Thus, a stable operation in a single transverse mode or a single longitudinal mode is also required as a laser characteristic.

In recent years, there has been developed a method in which a current constriction structure is formed so as to allow current to be injected only into a necessary region.

In this method, in order to enhance the performance of the surface emitting laser, current is allowed to be injected only into a necessary region by forming the current constriction structure in such a manner that a layer having a high Al composition, for example, an AlGaAs layer having an Al composition of 98% is formed in a multilayer film reflection mirror and selectively oxidized in a high temperature steam atmosphere.

Meanwhile, the above described method using selective oxidization is not desirable from the viewpoint of realizing a single transverse mode oscillation.

That is, a refractive index difference which is larger than needed is caused due to the existence of the oxidized layer, so that high order transverse modes are generated.

As a method to cope with this problem, there is used a method, and the like, in which a single transverse mode oscillation is achieved in such a manner that the diameter of the light emitting region is reduced to about 3 μm by using the above described current constriction structure so as to prevent the high order transverse modes from being confined.

However, in the method of restricting the light emitting region, the light emitting region is reduced, and thereby the output per element is significantly reduced.

For this reason, heretofore, there have been investigated methods for realizing a single transverse mode oscillation while maintaining a light emitting region which is larger to some extent than the region obtained in the case where the single transverse mode oscillation is realized only by reducing the light emitting region by using the above described current constriction structure.

That is, there have been investigated methods in which a single transverse mode oscillation can be realized by intentionally introducing a loss difference between a fundamental transverse mode and a high order transverse mode, while maintaining a light emitting region that is large to some extent.

As one of the methods, a so-called surface relief method is disclosed in Japanese Patent Application Laid-Open No. 2001-284722, H. J. Unold et al., Electronics Letters, Vol. 37, No. 9 (2001) 570, and J. A. Vukusic et al., IEEE JOURNAL OF QUANTUM ELECTRONICS, Vol. 37, No. 1, 2001 (108).

The surface relief method is a method in which the loss in the high order transverse mode is increased to be larger than the loss in the fundamental transverse mode by applying level difference processing to the element surface which is the light emitting surface of the surface emitting laser element.

Note that in the present specification, it is assumed that, in the following, the level difference structure, which is provided, as described above, in the light emitting region of the light emitting surface of the reflection mirror to control the reflectance of the reflection mirror, is referred to as a surface relief structure.

Generally, as a mirror for the VCSEL, there is used a multilayer film reflection mirror in which a plurality of pairs of layers, each of which has a different refractive index and an optical thickness of one fourth of a laser oscillation wavelength (that hereinafter may be referred to as ¼ wavelength unless otherwise specified), are laminated so that the two layers are alternately arranged.

Usually, the multilayer film reflection mirror is terminated by a high refractive index layer, so that a high reflectance of 99% or more is obtained by also using the reflection on the final interface with air having a low refractive index.

First, the concave surface relief structure shown in FIG. 2A is described hereinbelow.

Such concave surface relief structure is also disclosed in Japanese Patent Application Laid-Open No. 2001-284722.

In a low reflection region 204 shown in FIG. 2A, a low refractive index layer 208 (or which may be a high refractive index layer) is further added to the final layer of a high refractive index layer 206.

Thereby, there is obtained a concave surface relief structure in which the multilayer film reflection mirror is terminated so as to have the thickness thereof being increased by an optical thickness of ¼ wavelength.

According to such concave surface relief structure, the phase of a light beam reflected by the interface between the final layer of the multilayer film reflection mirror, here, the low refractive index layer 208, and the air having a further lower refractive index is shifted by π from the phase of the light beam which is totally reflected by the multilayer film reflection mirror and which exists under the interface.

For this reason, in the low reflection region 204, the reflectance is reduced to 99% or less, so that the reflection loss can be increased to about 5 to 15 times.

In order to introduce a loss difference between the basic transverse mode and the high order transverse mode by using this principle, the low reflection region 204 is formed only in the light emitting peripheral portion so as to increase the overlap between the low reflection region 204 and the high order transverse mode light distribution 212.

On the other hand, the high reflection region 202 is left in the light emitting central portion so as to increase the overlap between the basic transverse mode light distribution 210 and the high reflection region 202 having the high refractive index layer 206 as the final layer.

Thereby, the reflection loss is increased in the high order transverse mode, so that the oscillation in the high order transverse mode can be suppressed and only the oscillation of basic transverse mode can be obtained. In this case, as shown in FIG. 2A, a concave shape is formed as the relief shape.

Further, it is also possible to configure a convex surface relief structure in such a manner that as in the low reflection region 204 illustrated in FIG. 2B, the final layer of the high refractive index layer 206 is removed and that the multilayer film reflection mirror is terminated by the low refractive index layer 208.

Such convex surface relief structure is also disclosed in H. J. Unold et al., Electronics Letters, Vol. 37, No. 9 (2001) 570. Even by such configuration, the reflectance can be reduced based on the same principle as the concave shape, so that the fundamental transverse mode oscillation can be effected.

According to the above described surface relief structure in the prior art form disclosed in Patent Japanese Patent Application Laid-Open No. 2001-284722, and H. J. Unold et al., Electronics Letters, Vol. 37, No. 9 (2001) 570 and J. A. Vukusic et al., IEEE JOURNAL OF QUANTUM ELECTRONICS, Vol. 37, No. 1, 2001 (108), a single transverse mode oscillation can be realized while the light emitting region is maintained to be larger to some extent than the light emitting region obtained in the case where the single transverse mode is realized only by the current constriction structure.

However, the reflectance in the surface relief structure is sensitively influenced by the thickness of layers forming the surface relief structure, and has a great influence on realizing the single transverse mode oscillation. Therefore, it is extremely important to control the layer thickness in the manufacture of the surface relief structure.

That is, the surface relief structure has a feature that the reflectance (reflection loss) is very sensitive to the layer thickness removed or added in the manufacture of the surface relief structure.

Next, there will be further described features of the above described surface relief structure.

FIG. 3 is a figure which is described in J. A. Vukusic et al., IEEE JOURNAL OF QUANTUM ELECTRONICS, Vol. 37, No. 1, 2001 (108) and in which the layer thickness removed by the surface relief is plotted along the horizontal axis while the induced loss is plotted along the vertical axis (left side).

From FIG. 3, there can be seen a state where the loss has peaks appearing periodically with respect to the layer thickness which is removed.

Further, the peak is steep, and when a desired loss value is to be introduced, the layer thickness which is removed needs to be controlled with very high accuracy (+/−5 nm or less).

On the other hand, the amount of the loss greatly influences the extent to which the single mode oscillation is realized, and further greatly influences the output characteristic of the element.

Therefore, in the manufacture of the surface relief structure, it is necessary to highly precisely control the layer thickness in order to manufacture elements which have good reproducibility and uniformity and which are capable of performing a single mode operation with the same characteristics.

In other words, it can be said that for the manufacture of the surface relief structure, when the thickness of the layer to be removed or added can be simply grasped with high accuracy and when the layer thickness can be adjusted according to the grasped layer thickness, the reproducibility and uniformity in the manufacture of the element can be greatly improved.

An object of the present invention is to provide a surface emitting laser including a concave surface relief structure, the layer thickness of which can be highly precisely controlled and which is capable of performing a single mode operation with good reproducibility and uniformity, and to provide a manufacturing method of the surface emitting laser.

A further object of the present invention is to provide a surface emitting laser array configured by the above described surface emitting lasers, a manufacturing method of the surface emitting laser array configured by the surface emitting lasers, which is based on the above described manufacturing method of the surface emitting laser, and an optical apparatus including the surface emitting laser array.

SUMMARY OF THE INVENTION

The present invention is directed to a surface emitting laser which is configured by laminating on a substrate a lower reflection mirror, an active layer, and an upper reflection mirror, which includes, in a light emitting section of the upper reflection mirror, a structure for controlling reflectance that is configured by a low reflectance region and a concave high reflectance region formed in the central portion of the low reflectance region, and which oscillates at a wavelength of $\lambda$, wherein the upper reflection mirror is configured by a multilayer film reflection mirror based on a laminated structure formed by laminating a plurality of layers, the multilayer film reflection mirror includes a phase adjusting layer which has an optical thickness in the range of $\lambda/8$ to $3\lambda/8$ inclusive in a light emitting peripheral portion on the multilayer film reflection mirror, and an absorption layer causing band-to-band absorption is provided in the phase adjusting layer.

The absorption coefficient of the absorption layer can be set to 5000 cm$^{-1}$ or more for the wavelength $\lambda$.

The absorption layer can be arranged at a layer positioned at the middle point in a thickness direction of the phase adjusting layer, or arranged on the surface side from the layer positioned at the middle point in the thickness direction of the phase adjusting layer.

The present invention is directed to an optical apparatus comprising, as a light source, a surface emitting laser array configured by arranging a plurality of the surface emitting lasers.

The present invention is directed to a surface emitting laser which is configured by laminating on a substrate a lower reflection mirror, an active layer, and an upper reflection mirror, which includes, in a light emitting section of the upper reflection mirror, a structure for controlling reflectance that is configured by a low reflectance region and a concave high reflectance region formed in the central portion of the low reflectance region, and which oscillates at a wavelength of $\lambda$, wherein the upper reflection mirror is configured by a multilayer film reflection mirror based on a laminated structure formed by laminating a plurality of layers, the multilayer film reflection mirror includes a phase adjusting layer which has an optical thickness in the range of $\lambda/8$ to $3\lambda/8$ in a light emitting peripheral portion on the multilayer film reflection mirror, and an absorption layer causing band-to-band absorption is provided on the surface side from a layer laminated at the middle point in thickness of the laminated structure that configures the multilayer film reflection mirror.

The absorption coefficient of the absorption layer can be 5000 cm$^{-1}$ or more for the wavelength $\lambda$.

The absorption layer can be provided within five pairs of layers from the surface side of the laminated structure.

The absorption layer can be arranged so that when seen from the surface side of the multilayer film reflection mirror, a part of the absorption layer is included in the interface from a high refractive index layer to a low refractive index layer in the multilayer film reflection mirror.

The present invention is directed to an optical apparatus comprising, as a light source, a surface emitting laser array configured by arranging a plurality of the surface emitting lasers.

The present invention is directed to a surface emitting laser which is configured by laminating on a substrate a lower reflection mirror, an active layer, and an upper reflection mirror, which includes, in a light emitting section of the upper reflection mirror, a structure for controlling reflectance that is configured by a low reflectance region and a concave high reflectance region formed in the central portion of the low reflectance region, and which oscillates at a wavelength of $\lambda$, wherein the upper reflection mirror is configured by a multilayer film reflection mirror based on a laminated structure formed by laminating a plurality of layers, the multilayer film reflection mirror includes a phase adjusting layer which has an optical thickness in the range of $\lambda/8$ to $3\lambda/8$ in a light emitting peripheral portion on the multilayer film reflection mirror, and an absorption layer having an absorption coefficient of 5000 cm$^{-1}$ or more for the wavelength $\lambda$ is provided in the phase adjusting layer.

The present invention is directed to a surface emitting laser which is configured by laminating on a substrate a lower reflection mirror, an active layer, and an upper reflection mirror, which includes, in a light emitting section of the upper reflection mirror, a structure for controlling reflectance that is configured by a low reflectance region and a concave high reflectance region formed in the central portion of the low reflectance region, and which oscillates at a wavelength of $\lambda$, wherein the upper reflection mirror is configured by a multilayer film reflection mirror based on a laminated structure formed by laminating a plurality of layers, the multilayer film reflection mirror includes a phase adjusting layer which has an optical thickness in the range of $\lambda/8$ to $3\lambda/8$ in a light emitting peripheral portion on the multilayer film reflection mirror, and an absorption layer having an absorption coefficient of 5000 cm$^{-1}$ or more for the wavelength $\lambda$ is provided on the surface side from a layer laminated at the middle point in thickness of the laminated structure that configures the multilayer film reflection mirror.

The present invention is directed to a manufacturing method of a surface emitting laser in which a lower reflection mirror, an active layer, and an upper reflection mirror are successively laminated on a substrate, in which there is formed, in a light emitting section of the upper reflection mirror, a structure for controlling reflectance that is configured by a low reflectance region and a concave high reflectance region formed in the central portion of the low reflectance region, and which oscillates at a wavelength of $\lambda$, the manufacturing method comprising: forming, as the upper reflection mirror, a multilayer film reflection mirror based on a laminated structure; forming, on the multilayer film reflection mirror, a phase adjusting layer which is for reducing the reflectance and which includes an absorption layer causing band-to-band absorption; measuring reflection spectra by irradiating the surface of the phase adjusting layer with light; measuring a broad dip wavelength obtained by measuring the reflection spectra; and adjusting the thickness of the phase adjusting layer based on the dip wavelength.

The absorption coefficient of the absorption layer can be set to 5000 cm$^{-1}$ or more for the wavelength $\lambda$.

The manufacturing method of the surface emitting laser can further comprise forming, when the absorption layer is formed, the absorption layer at a layer positioned at the middle point in a thickness direction of the phase adjusting layer, or on the surface side from the layer positioned at the middle point in the thickness direction of the phase adjusting layer.

The present invention is directed to a manufacturing method of a surface emitting laser in which a lower reflection mirror, an active layer, and an upper reflection mirror are successively laminated on a substrate, in which there is formed, in a light emitting section of the upper reflection mirror, a structure for controlling reflectance that is configured by a low reflectance region and a concave high reflectance region formed in the central portion of the low reflectance region, and which oscillates at a wavelength of $\lambda$, the manufacturing method comprising: forming, when a multilayer film reflection mirror based on a laminated structure is formed as the upper reflection mirror, an absorption layer causing band-to-band absorption on the surface side in the laminated structure from a layer laminated at the middle point in thickness of the laminated structure; measuring reflection spectra by irradiating the laminated structure with light; measuring a broad dip wavelength obtained by measuring the reflection spectra; forming, after the multilayer film reflection mirror as the upper reflection mirror is formed, a phase adjusting layer for reducing reflectance on the multilayer film reflection mirror; and adjusting the thickness of the phase adjusting layer based on the dip wavelength.

The absorption coefficient of the absorption layer can be set to 5000 cm$^{-1}$ or more for the wavelength $\lambda$.

The manufacturing method of the surface emitting laser can further comprise forming, when the absorption layer is formed, the absorption layer within five pairs of layers from the surface side of the laminated structure.

The manufacturing method of the surface emitting laser can further comprise forming, when the absorption layer is formed, the absorption layer so that when seen from the surface side of the multilayer film reflection mirror, a part of the absorption layer is included in the interface from a high refractive index layer to a low refractive index layer in the multilayer film reflection mirror.

The manufacturing method of the surface emitting laser can further comprise forming, when the absorption layer is formed, the absorption layer so that the thickness of the absorption layer is set to 2 nm or more to 30 nm or less.

The present invention is directed to a manufacturing method of a surface emitting laser in which a lower reflection mirror, an active layer, and an upper reflection mirror are successively laminated on a substrate, in which there is formed, in a light emitting section of the upper reflection mirror, a structure for controlling reflectance that is configured by a low reflectance region and a concave high reflectance region formed in the central portion of the low reflectance region, and which oscillates at a wavelength of $\lambda$, the manufacturing method comprising: forming, as the upper reflection mirror, a multilayer film reflection mirror based on a laminated structure; forming, on the multilayer film reflection mirror, a phase adjusting layer which is for reducing the reflectance and which includes an absorption layer having an absorption coefficient of 5000 cm$^{-1}$ or more for the wavelength λ; measuring reflection spectra by irradiating the surface of the phase adjusting layer with light; measuring a broad dip wavelength obtained by measuring the reflection spectra; and adjusting the thickness of the phase adjusting layer based on the dip wavelength.

The present invention is directed to a manufacturing method of a surface emitting laser in which a lower reflection mirror, an active layer, and an upper reflection mirror are successively laminated on a substrate, in which there is formed, in a light emitting section of the upper reflection mirror, a structure for controlling reflectance that is configured by a low reflectance region and a concave high reflectance region formed in the central portion of the low reflectance region, and which oscillates at a wavelength of λ, the manufacturing method comprising: forming, when a multilayer film reflection mirror based on a laminated structure is formed as the upper reflection mirror, an absorption layer having an absorption coefficient of 5000 cm$^{-1}$ or more for the wavelength λ on the surface side in the laminated structure from a layer laminated at the middle point in thickness of the laminated structure; measuring reflection spectra by irradiating the laminated structure with light; measuring a broad dip wavelength obtained by measuring the reflection spectra; forming, after the multilayer film reflection mirror as the upper reflection mirror is formed, a phase adjusting layer for reducing reflectance on the multilayer film reflection mirror; and adjusting the thickness of the phase adjusting layer based on the dip wavelength.

According to the present invention, it is possible to realize a surface emitting laser including a concave surface relief structure, the layer thickness of which can be highly precisely controlled and which is capable of performing a single mode operation with good reproducibility and uniformity, and it is possible to realize a manufacturing method of the surface emitting laser.

Further features and aspects of the present invention will become apparent from the following detailed description of exemplary embodiments with reference to the attached drawings.

DESCRIPTION OF THE EMBODIMENTS

According to the above described configuration of the present invention, it is possible to manufacture a highly precise concave surface relief structure. Thereby, it is possible to provide a surface emitting laser which is capable of performing a single mode operation with excellent reproducibility and uniformity, and to provide a manufacturing method of the surface emitting laser.

This is based on the following knowledge obtained as a result of an extensive investigation by the present inventors.

The present inventors measured the reflection spectra of a wafer having the surface emitting laser layer structure before on element is formed.

Figure 5:
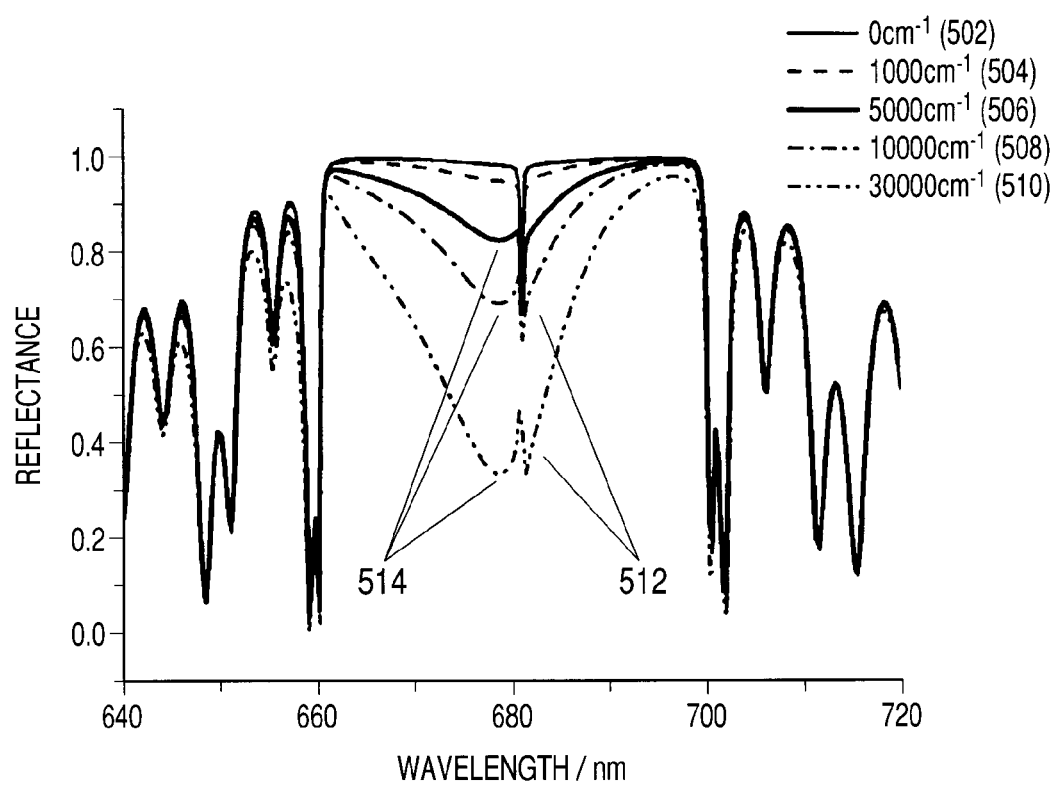
FIG. 5 is a figure for describing the difference in the dip shape due to the difference in the absorption coefficient of the absorption layer in the exemplary embodiment according to the present invention, and illustrating reflection spectra of the wafer layer structure of the surface emitting laser.

As a result, it was found that broad dips 514 are generated as indicated by lines 506, 508, and 510 in FIG. 5.

Then, there was found a method for quantitatively estimating the amount of introduced loss by grasping the wavelength (hereinafter referred to as dip wavelength) corresponding to the dip.

The dip wavelength reflects the thickness information of the layer forming the low reflection region in the relief structure, and the amount of introduced loss can be estimated in advance from the dip wavelength. In other words, it can be said that the layer thickness of the surface layer forming the low reflection region may be adjusted, that is, the layer thickness of a phase adjusting layer may adjusted so as to make the dip wavelength correspond to a desired amount of loss.

Next, the principle will be described.

FIG. 5 is a figure for describing the difference in the dip shape due to the difference in the absorption coefficient of the absorbing layer. In order that the dip wavelength 514 in the low reflection region in FIG. 5 can be grasped from the reflection spectrum measurement, the wafer layer structure needs to satisfy the following conditions.

As the first condition, in order to form a low reflection region, a phase adjusting layer having an optical thickness in the range of ⅛ wavelength to ⅜ wavelength inclusive is further provided on a multilayer film reflection mirror terminated by a high refractive index layer.

As the second condition, a layer which causes large absorption of an band-to-band absorption level (5000 cm$^{-1}$ or more) in the oscillation wavelength is provided in the phase adjusting layer and the multilayer film reflection mirror.

Figure 2A:
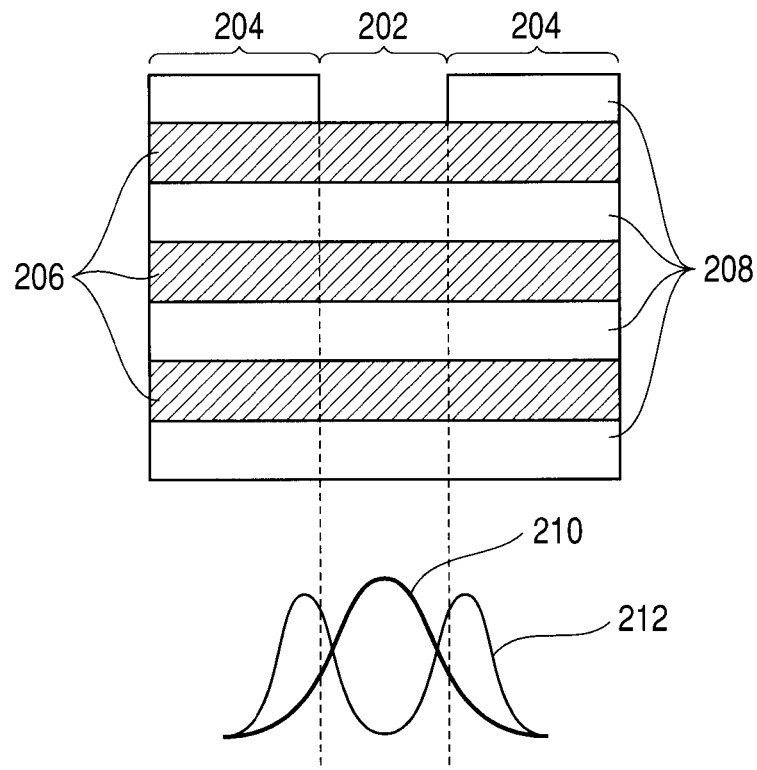
FIGS. 2A and 2B are cross-sectional schematic views for describing a concave surface relief structure (FIG. 2A) and a convex surface relief structure (FIG. 2B) which are used in the prior art form.
Figure 2B:
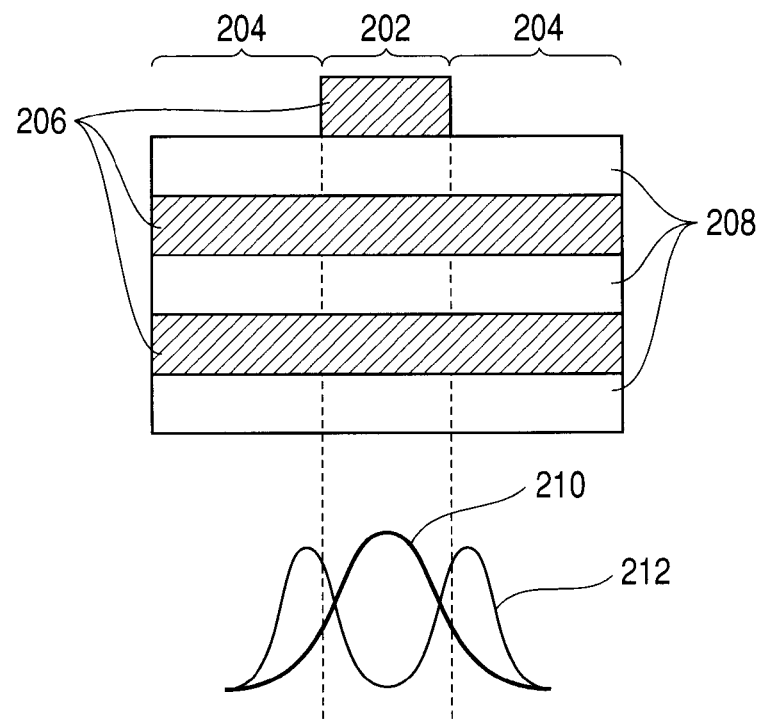

Here, a low reflection region of a relief structure which serves as the first condition corresponds to, for example, the low reflection region 204 in FIG. 2A.

The layer added based on the first condition exists on the outermost surface. The phase of light reflected by the interface between the added layer and the layer of air, a dielectric film, or the like, which further exists above the added layer and which has a refractive index lower than that of the added layer, is adjusted, that is, the layer thickness of the added layer is adjusted so that the light is reflected in reverse phase by the interface, and thereby the reflectivity as a whole is reduced.

In this specification, it is assumed that this final layer is referred to as a phase adjusting layer.

Figure 4:
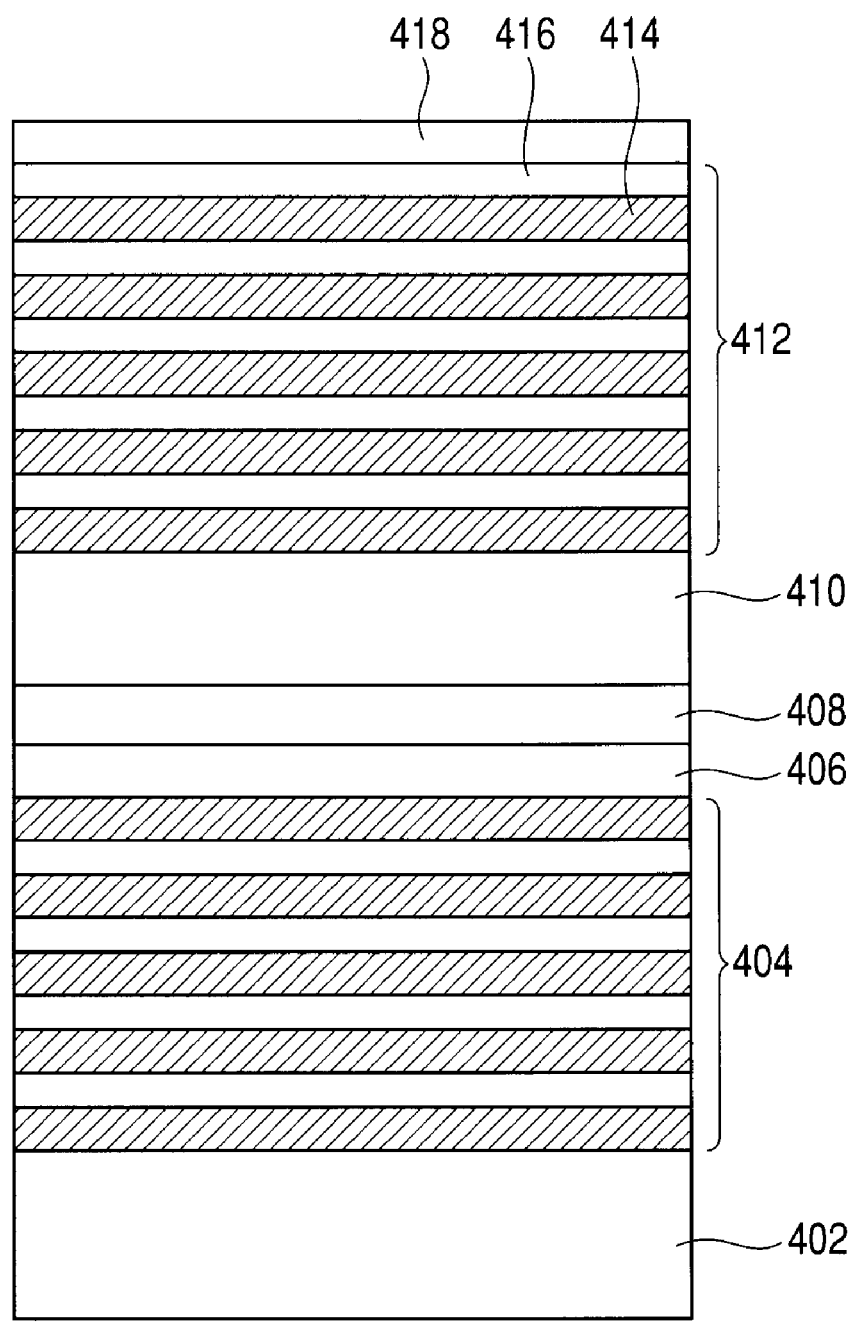
FIG. 4 is a cross-sectional schematic view for describing a wafer layer structure of a surface emitting laser including a concave surface relief structure in an exemplary embodiment according to the present invention.

FIG. 4 illustrates an example in the case of a red surface emitting laser based on a wafer layer structure satisfying the above described conditions. FIG. 5 illustrates examples of reflection spectra of the above described wafer layer structure.

The reflection spectra are measured so as to cover a range from the short wavelength side to the long wavelength side with the laser oscillation wavelength as the center.

As shown in FIG. 4, a GaAs phase adjusting layer 418 having an optical thickness of ¼ wavelength exists on an $Al_{0.5}Ga_{0.5}As$ high refractive index layer 416, and the GaAs layer absorbs light having an oscillation wavelength of 680 nm by band-to-band absorption.

Therefore, two of the above described first and second conditions are satisfied.

In this case, in the reflection spectra, there can be seen a sharp resonance wavelength 512 due to the high reflection band of the multilayer film reflection mirrors 412 and 404, and the surface emitting laser resonator, and further a broad dip wavelength 514 in the low reflection region can also be observed as shown by solid line 506 (in the case of absorption coefficient of 5000 cm$^{-1}$ or more) in FIG. 5.

Next, there will be described a reason why the dip wavelength 514 is generated due to the low reflection region, that is, the phase adjusting layer.

In the configuration according to the present exemplary embodiment, there is provided, on the normal multilayer film reflection mirror 412, a layer having an optical thickness of ¼ wavelength as the phase adjusting layer (GaAs layer 418).

Therefore, in view of the structure which is formed by combining the phase adjusting layer and the high refractive index layer ($Al_{0.5}Ga_{0.5}As$ high refractive index layer 416) existing immediately below the phase adjusting layer, and which has an optical thickness of ½ wavelength, a reflection mirror formed by the interface between the air and the GaAs layer exists in the upper portion of the structure, while a reflection mirror of the upper multilayer film reflection mirror 412 of the surface emitting laser exists in the lower portion of the structure.

That is, this means that a resonator is newly formed on the outermost surface of the low reflection region in addition to the surface emitting laser resonator. The resonance wavelength of the new resonator is observed as the dip wavelength 514 due to the phase adjusting layer.

However, in this state as it is, the reflectance of the interface between the air and the GaAs layer as the upper reflection mirror is greatly different from the reflectance of the upper multilayer film reflection mirror as the lower reflection mirror, and hence it is difficult to clearly observe the resonance wavelength.

Thus, the reflectance at the resonance wavelength can be greatly reduced by introducing the absorption as the second condition. By forming the broad dip, the value of the resonance wavelength of the dip can be practically specified.

FIG. 5 shows two kinds of reflection spectra in a case (502) where no absorption exists, and reflection spectra in a case (504) where small absorption (1000 cm$^{-1}$) exists.

In the case where no absorption or small absorption exists, the reduction in the dip can hardly be recognized, and hence the wavelength cannot be clearly specified.

Further, as the absorption of a semiconductor, free carrier absorption, and the like, may occur. However, in the free carrier absorption, even when a very high doping of about $1 \times 10^{20}$ cm$^{-3}$ is used, the absorption coefficient of only about 1000 cm$^{-1}$ can be obtained. As a result, a sufficient dip is not formed, and hence the object of the present invention cannot be sufficiently attained.

On the other hand, the absorption coefficient of the band-to-band absorption is generally in a range of 5000 cm$^{-1}$ or more, and hence sufficient dips are obtained as denoted by reference numerals 506, 508 and 510 in FIG. 5, so as to enable the wavelength to be specified.

Meanwhile, this absorption layer is indispensable to specify the dip wavelength 514 due to the phase adjusting layer, but the absorption layer is not necessary as the surface emitting laser and may cause decrease in laser element characteristics.

Therefore, there are some desirable forms in the structure and arrangement of the absorption layer. First, the absorption layer is arranged on the surface side from the middle point in thickness of the upper multilayer film reflection mirror, on the side opposite to the substrate used for the crystal growth. It is preferred that the absorption layer is formed within five pairs of layers on the surface side of the upper multilayer film reflection mirror.

Figure 6:
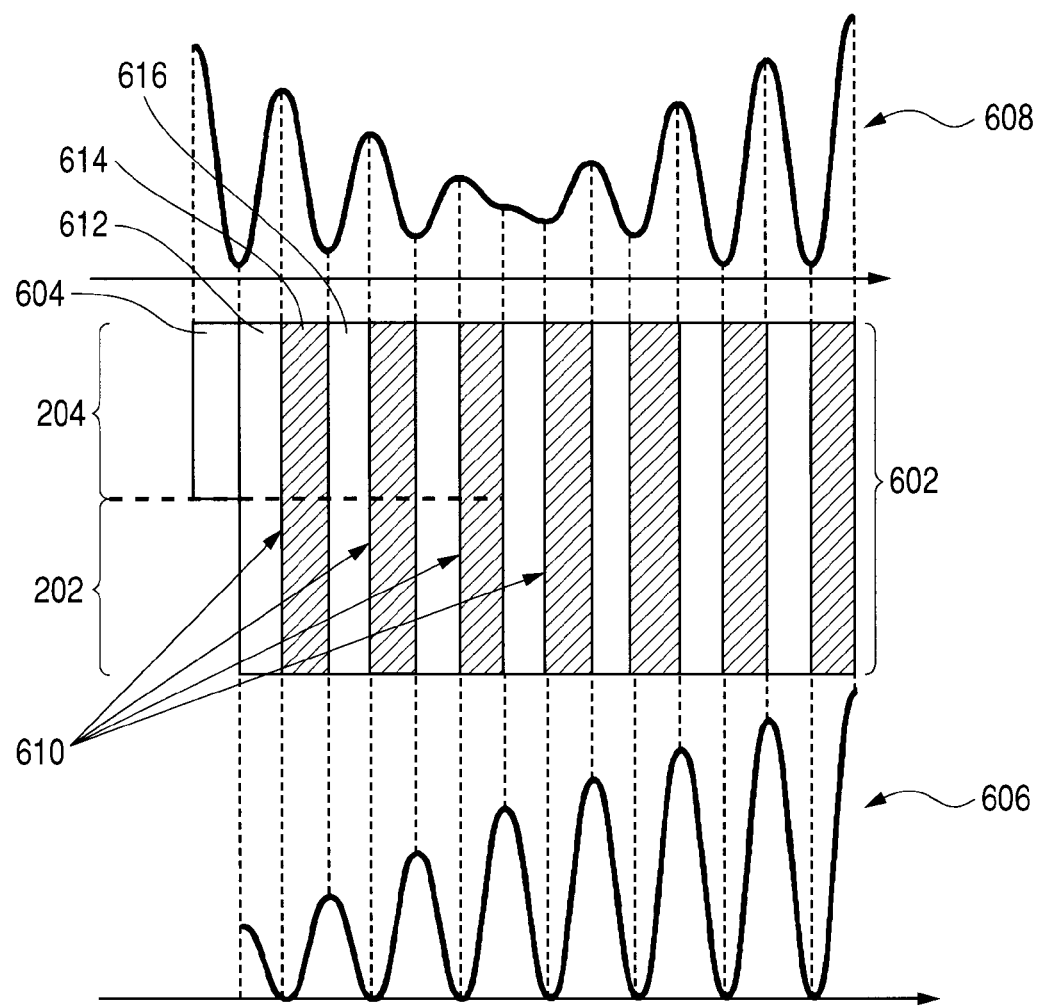
FIG. 6 is a figure for describing the layer structure of the multilayer film reflection mirror of the surface emitting laser in the exemplary embodiment according to the present invention, and internal light intensity distributions at the time when the element is driven and when the reflection spectra are measured.

This is because when the surface emitting laser functions to oscillate in the single fundamental transverse mode, the light distribution in the in-plane direction is concentrated on the high reflection region where no phase adjusting layer exists, and the light distribution in the depth direction is reduced toward the surface as denoted by reference numeral 606 in FIG. 6.

On the other hand, when the reflection spectra of the low reflection region where a phase adjusting layer exists are measured, the light distribution is increased toward the outermost surface as denoted by reference numeral 608 in FIG. 6.

However, even in the low reflection region, the light distribution is gradually increased, as shown in FIG. 6, on the side near an active layer (substrate) in the multilayer film reflection mirror.

Therefore, when the absorption layer is arranged on the side near the surface in the multilayer film reflection mirror, the necessary absorption is increased at the time of reflection spectrum measurement so as to enable the resonance wavelength 514 to be clearly specified, while unnecessary absorption is reduced at the time of operation of the surface emitting laser, so as to suppress the degradation of the element characteristics.

Further, as shown in FIG. 6, it is preferred that in the upper multilayer film reflection mirror, the absorption layer is arranged near a interface 610 from the high refractive index layer to the low refractive index layer, when seen from the surface.

In this case, as shown in FIG. 6, on the surface side of the multilayer film reflection mirror, an antinode is formed near the interface in the low reflection region as shown by the light distribution 608, so that the absorption is increased. Thereby, the dip wavelength 514 can be measured more clearly in the reflection spectrum measurement.

On the other hand, a node of the light distribution 606 is formed near the interface in the high reflection region, so that the absorption can be suppressed as much as possible and the influence of the absorption layer on the element characteristics can be minimized.

Figure 14:
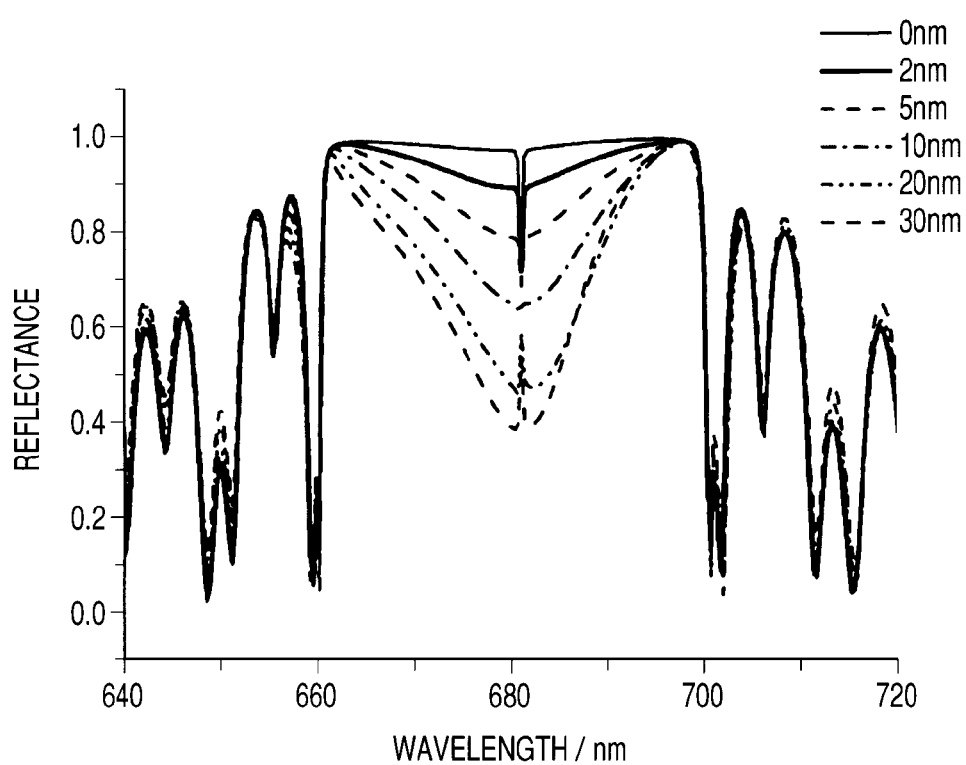
FIG. 14 is a figure for describing the difference in the dip shape due to the difference in the thickness of the absorption layer in the exemplary embodiment according to the present invention, and illustrating reflection spectra of the wafer layer structure of the surface emitting laser.

Further, it can be seen from FIG. 14 that the thickness of the absorption layer needs to be set to at least 2 nm or more in order to enable the dip wavelength to be clearly observed.

On the other hand, when the thickness of the absorption layer is excessively increased, unnecessary absorption is increased during operation of the element. Thus, it is preferred that the thickness of the absorption layer is set to be less than the half (about 30 nm) of the layer configuring the multilayer film reflection mirror.

Alternatively, it is also preferred to arrange the absorption layer in the phase adjusting layer. This is because in the high reflection region where the in-plane direction light distribution of the desired fundamental transverse mode is concentrated, the phase adjusting layer is removed by being etched in a concave shape, and hence the light is hardly absorbed in the high reflection region at the time of operation of the element.

The layer thickness of the absorption layer in this case may be set comparatively large because the absorption layer is removed. Further, in consideration of the fact that the absorption layer is also used as a contact layer for an electrode, it is preferred that the layer thickness of the absorption layer is set to 10 nm or more. It is more preferred that the layer thickness of the absorption layer is set to 20 nm or more.

Subsequently, in order to clarify the relationship between the dip wavelength and the introduced reflection loss, the variations were assumed in the thickness of the layers configuring the phase adjusting layer and the multilayer film reflection mirror, and the dip wavelength and the loss were investigated in the case where such variations were caused.

Specifically, the dip wavelength and the loss were investigated by assuming not only the case where the layer thickness of the phase adjusting layer (604, first layer) as shown in FIG. 6 is varied, but also the case where the layer thickness of all of the layers (612, 614 and 616) configuring the multilayer film reflection mirror under the phase adjusting layer is varied.

That is, the case where the layer thickness of each of the second layer (612), the third layer (614), and the fourth layer (616) is separately varied in the range of −20 to +20 nm from a target value (usually set to the optical thickness of ¼ wavelength), was assumed as the case which may be caused in the crystal growth, and the like.

Then, there was investigated how the dip wavelength and the reflection loss were changed in this case.

When each of the layers in FIG. 6 is made to specifically correspond to the layers in FIG. 4, the first layer corresponds to the GaAs phase adjusting layer 418 having the optical thickness of ¼ wavelength.

Further, the second layer corresponds to the $Al_{0.5}Ga_{0.5}As$ high refractive index layer 416, and the third layer corresponds to the $Al_{0.9}Ga_{0.1}As$ low refractive index layer 414.

Further, the fourth layer corresponds to the layer having the optical thickness of ¼ wavelength ($Al_{0.5}Ga_{0.5}As$ high refractive index layer) existing under the third layer.

Figure 7:
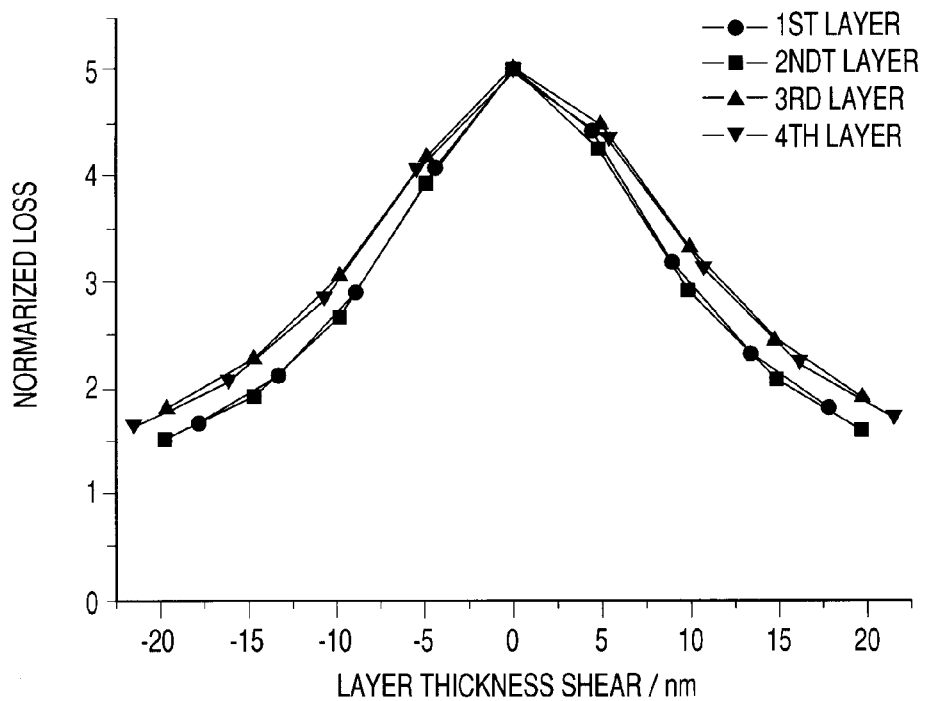
FIG. 7 is a figure for describing the layer thickness dependency of the normalized loss introduced into the low reflection region in the exemplary embodiment according to the present invention, and illustrating the normalized loss introduced when the layer thickness of each of the first layer to the fourth layer is varied.

FIG. 7 illustrates the change of the loss introduced when the thickness of each of the layers is varied.

Here, there was used, as a loss, a value (normalized loss) normalized by the loss value in the high reflection region 202.

From this figure, it was seen that not only when the thickness of the phase adjusting layer as the first layer is varied but also when the thickness of the second, third, or fourth layer that exists under the first layer is varied, the loss introduced according to the variation amount is almost similarly changed.

In other words, this means that highly precise control of only the thickness of the phase adjusting layer is not sufficient to control the introduced loss.

From this investigation, it was found that it is necessary to control the thickness of the whole layers including the phase adjusting layer and the layers which exist under the phase adjusting layer and which configure the multilayer film reflection mirror.

Subsequently, there was also investigated here a relationship between the shift in the dip wavelength in the low reflection region, which shift is caused by the phase adjusting layer, and the introduced loss in the case where the thickness of each of the four layers is separately varied as described above.

Here, the shift in the dip wavelength means a shift from the reference set to the dip wavelength in the case where the phase adjusting layer has the optical thickness of ¼ wavelength.

Figure 8:
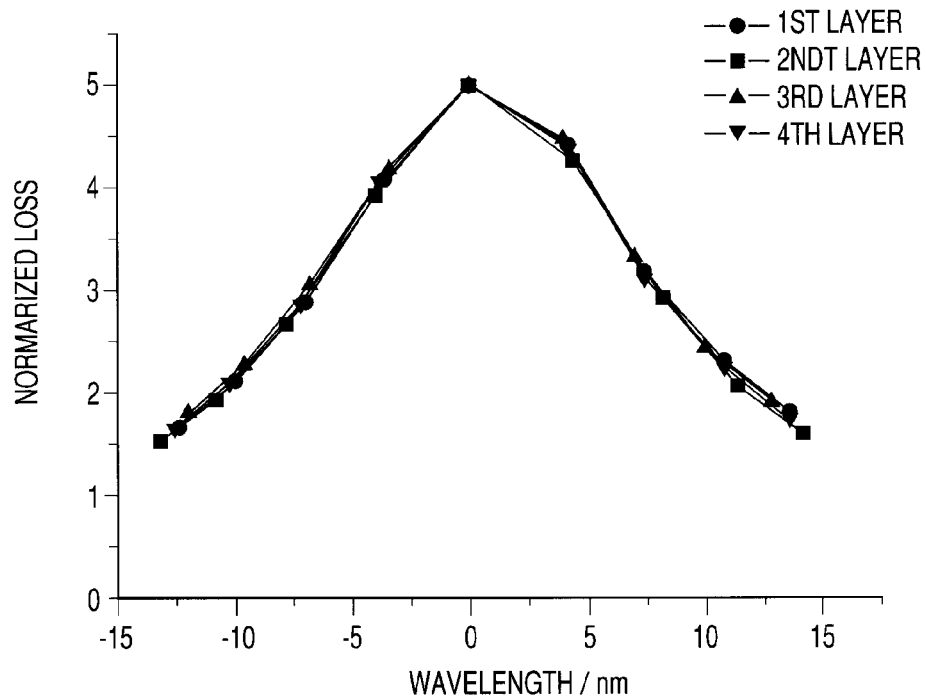
FIG. 8 is a figure for describing the dip wavelength dependency of the normalized loss introduced into the low reflection region in the exemplary embodiment according to the present invention, and illustrating the normalized loss introduced when the layer thickness of each of the first layer to the fourth layer is varied.

FIG. 8 illustrates the obtained relationship.

The horizontal axis represents the shift in the dip wavelength and the vertical axis represents the loss normalized similarly to FIG. 7.

As a result, it can be seen that even when not only the thickness of the phase adjusting layer as the first layer but also the thickness of the second, third or fourth layer, which exists under the first layer, are varied, the dip wavelength is shifted by the amount corresponding to the varied amount of each of the layers, and the loss is reduced almost similarly according to the shift of the dip wavelength.

In other words, it was found that as long as only the shift in the dip wavelength was grasped, the introduced loss could be quantitatively estimated without the need to precisely grasp the variation amount of each of the layers.

Further, it can be seen from the figure that a necessary loss can be obtained by adjusting, for example, the thickness of the phase adjusting layer so as to make the dip wavelength become a value corresponding to the loss.

Here, description is given by taking as an example the red surface emitting laser, and hence the GaAs layer is taken as an example of the absorption layer. However, any layer may be used as long as the layer exhibits a sufficient absorption performance at the oscillation wavelength.

For example, AlGaAs, AlGaAsP, InGaAsP, InGaAs, and the like are listed for a red surface emitting laser having a wavelength of 680 nm. There is listed InGaAs for a surface emitting laser having a wavelength band of 850 to 980 nm.

Further, for a ZnSe based surface emitting laser having a shorter wavelength, there are listed MgZnCdSSeTe, ZnCdSe, and the like. For a GaN based surface emitting laser, there are listed AlGaInNPAs, InGaN, and the like.

Next, there will be specifically described a manufacturing procedure of a surface relief structure using this principle.

First, a necessary loss value in the low reflection region is determined in order to obtain desired element characteristics.

There are calculated a layer thickness corresponding to the loss and a dip wavelength in the low reflection region in the case of the loss.

For example, when a normalized loss of 5 in FIG. 8 is necessary, the shift from the dip wavelength in the low reflection region in the case where each of the layers of the region is formed to have the layer thickness equivalent to the optical thickness of ¼ wavelength, is set to 0 nm as the target value of the dip wavelength.

On the other hand, when a normalized loss of 4 is necessary, the wavelength shift from the dip wavelength in the low reflection region in the case where each of the layers of the region is formed to have the layer thickness equivalent to the optical thickness of ¼ wavelength, is set to −4 nm or +5 nm as the target value of the dip wavelength.

At the time when the phase adjusting layer as the final layer is crystally grown, the reflection spectra is measured, so as to check whether or not the shift of the dip wavelength is set to the above described desired value.

When the shift is not sufficient, crystal growth is performed again, while when the shift is excessive, the adjustment is performed by etching, and the like.

In this way, the crystal growth may be performed again after the measurement of the reflection spectra, and hence it is preferred that the outermost surface of the wafer is terminated by a layer not containing Al.

Alternatively, by performing in situ observation of the reflection spectra during the crystal growth, the crystal growth may be ended at the time when a desired dip wavelength is obtained.

In this case, it is not necessary to take out the wafer from the crystal growing apparatus, and hence the outermost surface of the wafer need not necessarily be terminated by a layer not containing Al.

Next, there will be described the formation of a relief structure in the wafer in which the amount of the introduced loss is controlled as described above.

A concave relief as shown in FIG. 2A is formed by removing the phase adjusting layer presently existing at the outermost surface by using dry or wet etching.

Figure 3:
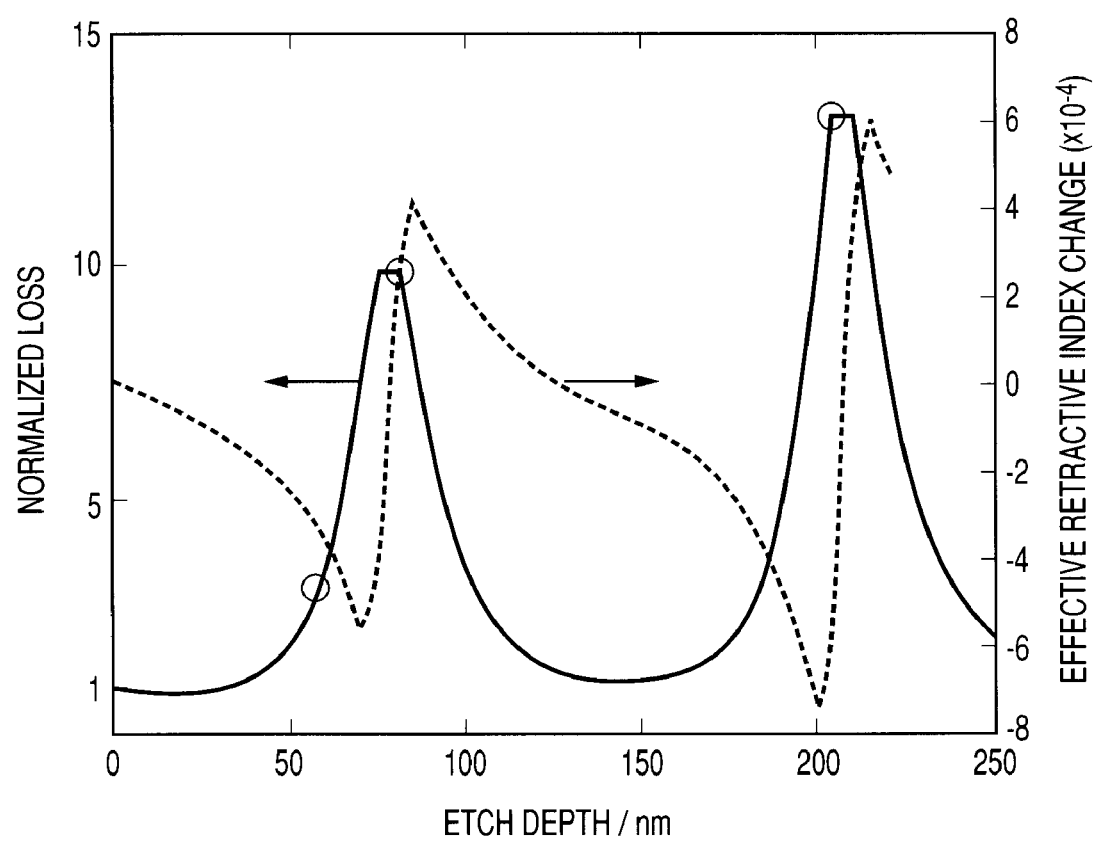
FIG. 3 is a figure for describing the layer thickness dependency of the normalized loss introduced into a laser including the surface relief structure, which is a prior art form and is disclosed in Non-patent document 2, and is a figure obtained by plotting the layer thickness removed by the surface relief along the horizontal axis, and plotting the introduced loss along the vertical axis (left side).

As shown in FIG. 3, the allowable layer thickness, at which the high reflectance (low loss region) can be obtained, has conversely a wide range (+/−15 nm), and hence the controllability required for the above described etching is low.

On the other hand, the selective etching using an etching-stop layer may also be used in order to further improve the reproducibility and uniformity.

Here, specifically, only the GaAs layer as the final layer may be etched selectively with respect to the $Al_{0.5}Ga_{0.5}As$ high refractive index layer that exists under the GaAs layer, and the etching depth can be controlled by using a citric acid based etchant without the influence of time.

A highly precise relief can be formed by performing the above described procedure, and thereby an element having excellent reproducibility and uniformity can be formed.

According to the manufacturing method of the above described exemplary embodiment, a concave surface relief structure can be manufactured with good precision, but the material used for the manufacture of the surface relief structure is not limited to the AlGaAs based semiconductor material.

For example, various semiconductor materials, such as other III-V group compound semiconductors or II-VI group compound semiconductors, can be used.

Further, the above described structure of the present exemplary embodiment can also be applied to a relief structure using other materials, such as a dielectric material and a metallic material.

Further, in the above, description is given by taking as an example a surface emitting laser structure, but the principle according to the present invention is not limited to the surface emitting laser. The principle according to the present invention can be applied to a light emitting and receiving element using a general multilayer film reflection mirror.

EXEMPLARY EMBODIMENTS

In the following, there will be described exemplary embodiments according to the present invention.

Exemplary Embodiment 1

As exemplary embodiment 1, there will be described a configuration example of a vertical cavity surface emitting laser including a concave surface relief structure and oscillating at 680 nm, and a manufacturing method of the surface emitting laser.

Figure 1:
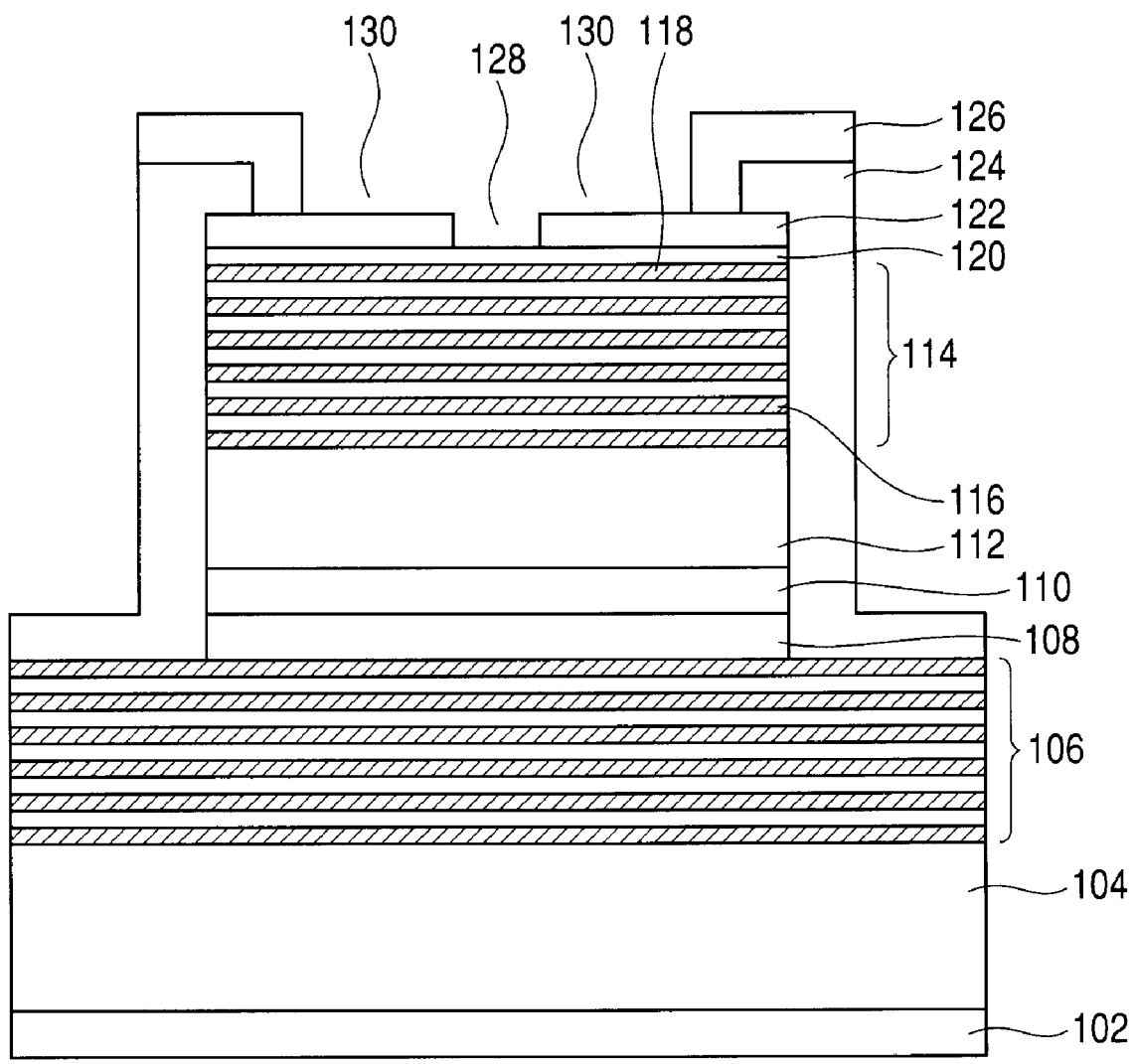
FIG. 1 is a cross-sectional schematic view for describing a vertical cavity surface emitting laser including a concave surface relief structure in exemplary embodiment 1 according to the present invention, and a manufacturing method of the surface emitting laser.

FIG. 1 is a cross-sectional schematic view for describing a configuration example of a vertical cavity surface emitting laser in the present exemplary embodiment.

In FIG. 1, reference numeral 102 denotes an n-side electrode, reference numeral 104 denotes an n-type GaAs substrate, reference numeral 106 denotes an n-type AlAs/$Al_{0.5}Ga_{0.5}As$ multilayer film reflection mirror, reference numeral 108 denotes an n-type AlGaInP spacer layer, and reference numeral 110 denotes a GaInP quantum well active layer.

Reference numeral 112 denotes a p-type AlGaInP spacer layer, reference numeral 114 denotes a p-type $Al_{0.9}Ga_{0.1}As$/$Al_{0.5}Ga_{0.5}As$ multilayer film reflection mirror, and reference numeral 116 denotes a $Al_{0.98}Ga_{0.02}As$ oxidization constriction layer.

Reference numeral 118 denotes a p-type $Al_{0.9}Ga_{0.1}As$ low refractive index layer, and reference numeral 120 denotes a p-type $Al_{0.5}Ga_{0.5}As$ high refractive index layer.

Reference numeral 122 denotes a phase adjusting layer, and here, a GaAs layer is used as the phase adjusting layer.

Further, high concentration p-type doping of $5 \times 10^{19}$ cm$^{-3}$ or more is performed to this layer in order to enable the layer to also function as a contact layer. Reference numeral 124 denotes an insulating film, and reference numeral 126 denotes a p side electrode.

In the present exemplary embodiment, the active layer 110 has a multiple quantum well structure which is configured by a plurality of GaInP quantum well layers and a plurality of $Al_{0.25}Ga_{0.25}In_{0.5}P$ barrier layers. The layer thickness of the p-type AlGaInP spacer layer 108 and the p-type AlGaInP spacer layer 112 is adjusted so that the multiple quantum well structure is located at an antinode of an internal light standing wave. As a resonator configured by these layers and having an oscillation wavelength of 680 nm, the layer thickness of the layers is adjusted to become an integer multiple of the oscillation wavelength. The active layer itself is adjusted and manufactured so as to have an emission peak wavelength (for example, 660 to 670 nm) which is set on the shorter wavelength side of the resonance wavelength of the surface emitting laser resonator.

The n-type multilayer film reflection mirror 106 is configured by laminating 60 pairs of an n-type AlAs low refractive index layer and an n-type $Al_{0.5}Ga_{0.5}As$ high refractive index layer, each of which layer has an optical thickness of ¼ oscillation wavelength of 680 nm.

The center wavelength of the reflection band of this reflection mirror is adjusted to 680 nm which is the oscillation wavelength. Si and Se are doped in order to obtain n-type conductivity.

In order to further lower the electric resistance, there may also be used a method, such as a method of providing a composition inclined layer between two layers having different refractive indexes, and a method of using a modulation doping in which the doping amount is reduced around an antinode of the light distribution to lower the electric resistance while reducing the optical absorption, and in which the doping amount is increased around a node of the light distribution.

The P-type multilayer film reflection mirror 114 is configured by laminating 38 pairs of the p-type $Al_{0.9}Ga_{0.1}As$ low refractive index layer 118 and the p-type $Al_{0.5}Ga_{0.5}As$ high refractive index layer 120, each of which layer has the optical thickness of ¼ wavelength of 680 nm.

The center wavelength of the reflection band of this reflection mirror is adjusted to 680 nm which is the oscillation wavelength. C and Zn are doped in order to obtain p-type conductivity. In order to further lower the electric resistance, such a method as is used for the n-type multilayer film reflection mirror can be applied also to the p-type reflection mirror.

One of the p-type $Al_{0.9}Ga_{0.1}As$ low refractive index layers 118 near the active layer in the p-type multilayer film reflection mirror is replaced by the p-type $Al_{0.98}Ga_{0.02}As$ oxidization constriction layer 116. This layer is selectively oxidized under a high temperature steam atmosphere, so as to be insulated from the peripheral portion of the element, and thereby a current constriction structure which allows current to flow only through the central portion thereof is formed.

In the present exemplary embodiment, the region in which current is allowed to flow by the oxidization constriction was adjusted to an almost circular shape having a diameter of 6 μm.

Usually, the p-type multilayer film reflection mirror 114 is terminated by the high refractive index layer 120 having the optical thickness of ¼ wavelength.

In the present exemplary embodiment, in order to realize a single fundamental transverse mode oscillation, the light emitting central portion is terminated as usual by the high refractive index layer 120 so that high reflectance necessary for the oscillation can be obtained. In this case, the phase adjusting layer 122 is further added onto the high refractive index layer 120 in the light emitting peripheral portion so that the low reflectance enough to prevent the high order mode oscillation can be obtained.

Next, there will be described in detail an example of a manufacturing method of the vertical cavity surface emitting laser in the present exemplary embodiment.

The structure of the vertical cavity surface emitting laser is the same as the structure as described above, and is manufactured by the following processes.

First, in the first process, the layer thickness of the phase adjusting layer is determined.

Next, in the second process, the absorption layer is determined.

Next, in the third process, the dip wavelength due to the phase adjusting layer is calculated.

Next, in the fourth process, after the phase adjusting layer is grown, the reflection spectra are measured and then compared with the calculation value of the dip wavelength obtained in the third process. The layer thickness of the phase adjusting layer is adjusted until the actually measured value of the dip wavelength coincides with the calculation value.

Next, in the fifth process, an element is formed by using the wafer subjected to the above described adjustment.

In the following, there will be described in more detail each of the above described processes in order.

In the first process, there is determined the layer thickness of the phase adjusting layer which causes a loss necessary to realize the single mode oscillation.

In the present exemplary embodiment, there was selected the GaAs layer having the optical thickness of ¼ wavelength (in this case 45 nm) as the layer thickness which allows the normalized loss of 5 as illustrated in FIG. 8 to be obtained.

Here, the optical thickness of ¼ wavelength was selected. However, according to required element characteristics, a layer thickness corresponding to a necessary loss may be determined, for example, by referring to FIG. 7.

In the second process, an band-to-band absorption layer is arranged in the phase adjusting layer or the upper multilayer film reflection mirror so as to enable the dip wavelength to be measured with good precision. More preferably, the band-to-band absorption layer may be arranged in the form as described above.

Further, in order to form the high reflection region with good precision, it is preferred to configure such that the phase adjusting layer 122 can be etched selectively with respect to the p-type $Al_{0.5}Ga_{0.5}As$ high refractive index layer 120.

As an example of a structure satisfying the above, the GaAs layer serving as the absorption layer for the oscillation wavelength of 680 nm was selected, so as to be arranged in the whole phase adjusting layer.

The phase adjusting layer made of GaAs can be selectively etched by using a citric acid based etchant, and the like, with respect to the $Al_{0.5}Ga_{0.5}As$ high refractive index layer 120 in the multilayer film reflection mirror.

In the third process, there is calculated the reflection spectra in the structure in which all the layers up to the phase adjusting layer are formed.

Figure 10:
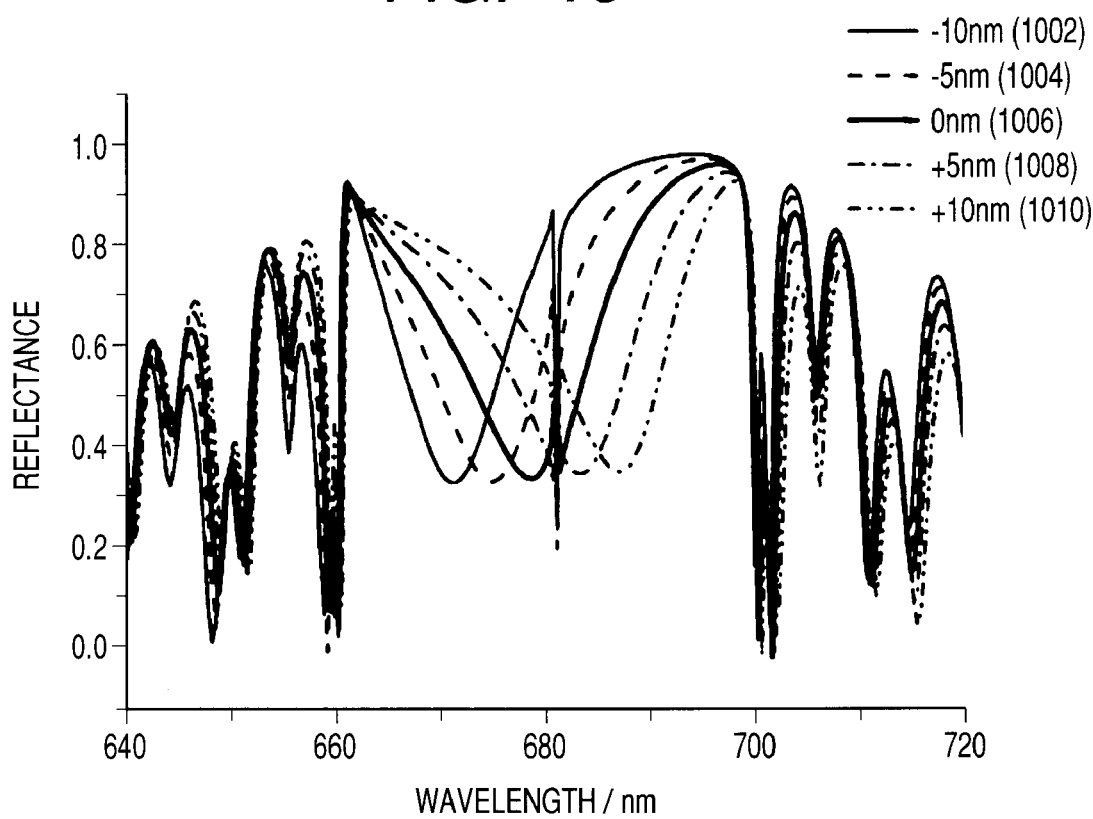
FIG. 10 is a figure for describing the difference in the dip wavelength due to the difference in the layer thickness of the surface layer in the reflection region of the exemplary embodiment according to the present invention, and illustrating the reflection spectra of the wafer layer structure of the surface emitting laser.

FIG. 10 illustrates the calculation result. Here, there are illustrated the changes in the reflection spectra in the case where the layer thickness of the phase adjusting layer is intentionally changed in a range from −10 nm to +10 nm at every 5 nm based on the target value of 45 nm that is the optical thickness of ¼ wavelength.

In the multilayer film reflection mirror reflection band spectra, there is clearly observed a large dip which is significantly different from the reflection spectra of the conventional surface emitting laser wafer, and which is greatly influenced by the resonator formed by the phase adjusting layer including the absorption layer.

When the thickness of the phase adjusting layer is changed, the dip wavelength is changed according to the change in the thickness. When the measurement resolution of the dip wavelength is set in the range of several nm, the variation in the layer thickness is also suppressed within the range of +/−5 nm, so that a desired loss can be introduced.

In the fourth process, the reflection spectra of the manufactured wafer are measured.

Figure 11A:
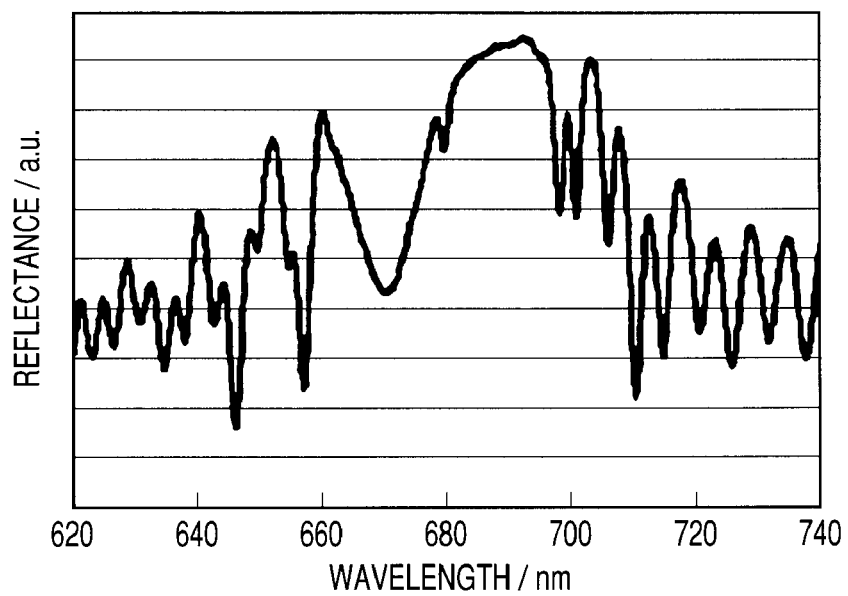
FIGS. 11A and 11B are figures illustrating actual measurement results of the reflection spectra of the wafer manufactured in exemplary embodiment 1 according to the present invention.
Figure 11B:
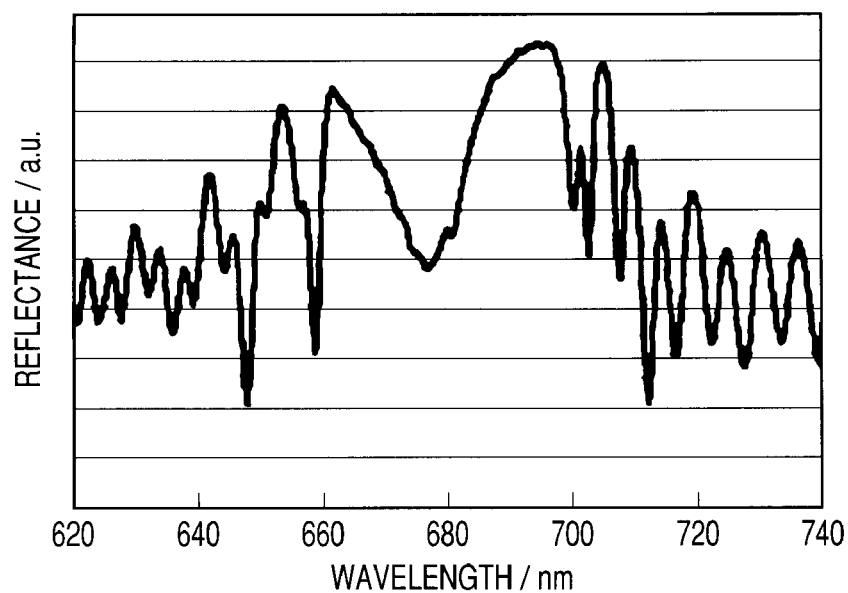

FIGS. 11A and 11B illustrate the actually measured results.

FIG. 11A illustrates the measured result of reflection spectra of the wafer which was manufactured by actually aiming at 45 nm of the layer thickness of the phase adjusting layer and in which the crystal growth was once stopped after the formation of the phase adjusting layer.

From the comparison between the measured results in FIG. 11A and FIG. 10, it is seen that the dip wavelength in FIG. 11 appears in the short wavelength side from the dip wavelength in the case of the optical thickness of ¼ wavelength.

This means that, in spite of 45 nm of the layer thickness actually targeted as the layer thickness of the phase adjusting layer, the measured layer thickness is identified to be 37.5 nm, which is smaller by about 7.5 nm than the target layer thickness, because the layer was grown at a lower growth rate than estimated due to low temperature growth or etch back by high concentration C doping.

Then, a layer of 7.5 nm was added to the wafer.

The added layers is the GaAs layer which is the same as the layer existing at the uppermost surface and doped with high concentration C. The layer was added by crystal growth.

FIG. 11B illustrates the measurement result of the reflection spectrum of the wafer. From the similar comparison between the measured results in FIG. 11B and FIG. 10, it can be estimated that, in FIG. 11B, the layer thickness is set to about 45 nm as adjusted.

In this way, according to the method of the present exemplary embodiment, the loss can be controlled in extremely high precision based on the dip wavelength obtained by the reflection spectrum measurement.

In the fifth process, the element formation is performed by using the wafer subjected to the layer thickness adjustment of the final layer, here by using the wafer in FIG. 11B.

First, the surface relief is formed. As the mask pattern forming process for forming the relief, a dielectric layer is deposited, and $SiO_2$ is patterned by using photo lithography and wet etching using buffered fluoric acid.

Subsequently, the GaAs phase adjusting layer 122 is selectively etched by using citric acid based etchant with respect to the $Al_{0.5}Ga_{0.5}As$ high refractive index layer 120, so that a concave relief having a diameter of φ3.5 μm is formed.

Next, a mesa having a diameter of 20 to 30 μm is formed. Similarly to the above, the dielectric layer is patterned again and etched by dry etching, and the like, until at least the side surface of the AlGaAs selective oxidation layer is exposed.

At this time, alignment is performed with care to make the center of the relief diameter match with the center of the mesa diameter. Alternatively, there may also be adopted a process which enables the self-alignment of the centers.

Then, the $Al_{0.98}Ga_{0.02}As$ oxidization constriction layer 116 is oxidized from the periphery of the mesa as required under high temperature steam atmosphere.

Here, the oxidation time is adjusted so that there is formed an oxidation constriction region which allows current to flow in the central region of a diameter of 6 μm. Then, a necessary dielectric layer is deposited and patterned again, so as to expose a portion of the p-type GaAs contact layer, on which portion a ring shaped Ti/Au is vapor-deposited so as to be formed as the p side electrode.

Then, AuGe/Ni/Au is vapor-deposited on the rear surface of the n-type GaAs substrate and annealed at about 400° C., so that the n side electrode is formed.

Finally, a chip of a necessary size is cut from the wafer. The chip is die-bonded to a package and the p side electrode is wire bonded, so that an element is completed.

Further, when the mask for an array is suitably designed, it is possible to manufacture not only a single element but also an array in which a plurality of elements are two dimensionally arranged. In this way, the advantage of the surface emitting laser is that an array structure can be obtained comparatively easily only by changing the mask.

According to the above described configuration of the present exemplary embodiment, the reproducibility of the amount of introduced loss is significantly improved by the reflection spectrum measurement, so that the reproducibility and uniformity between wafers can be significantly improved.

Exemplary Embodiment 2

As exemplary embodiment 2, there is described a vertical cavity surface emitting laser which includes a concave surface relief structure and similarly oscillates at 680 nm.

Figure 9:
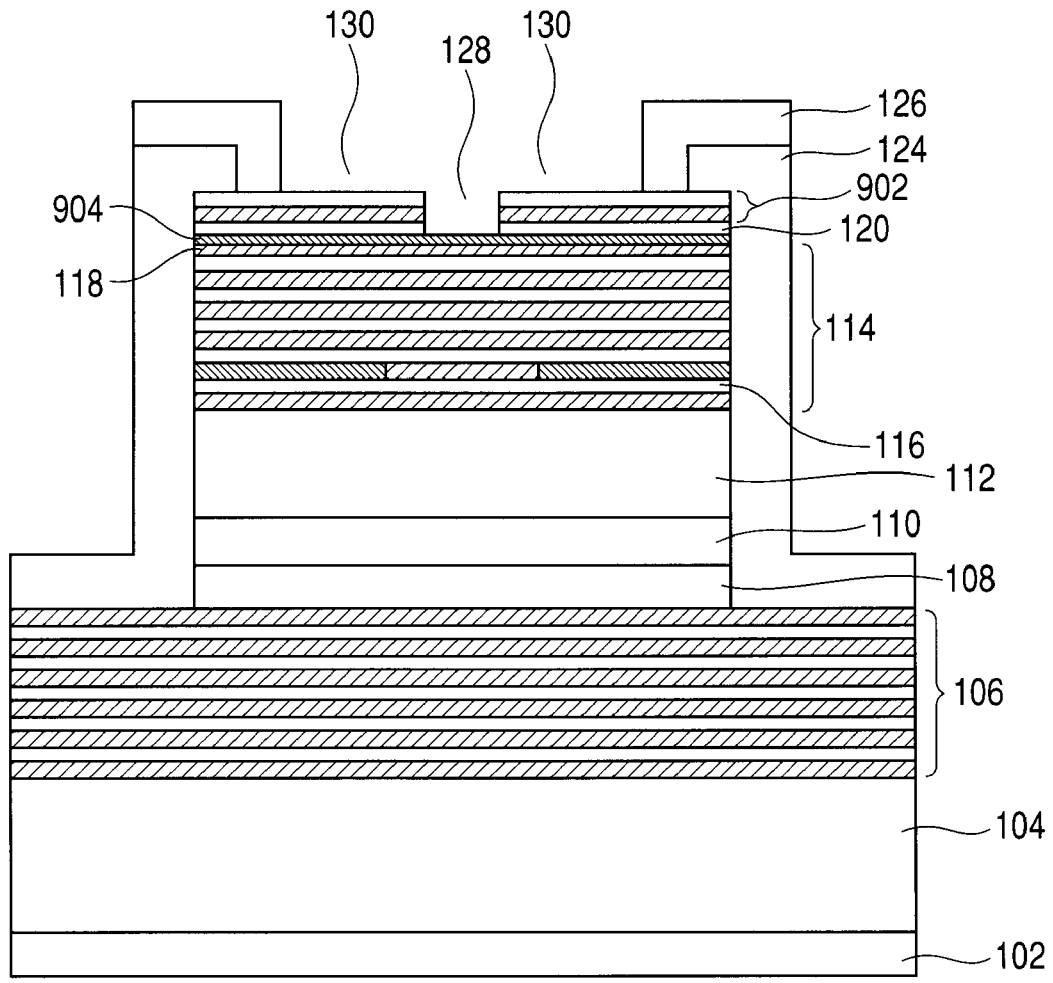
FIG. 9 is a cross-sectional schematic view for describing a vertical cavity surface emitting laser including the concave surface relief structure in exemplary embodiment 2 according to the present invention, and a manufacturing method of the vertical cavity surface emitting laser.

FIG. 9 is a cross-sectional schematic view for describing a configuration example of a vertical cavity surface emitting laser in the present exemplary embodiment.

In FIG. 9, the same portions as those illustrated in FIG. 1 are denoted by the same reference numerals. Thus, the description of the same portions is omitted, and only different portions are described.

In FIG. 9, reference numeral 902 denotes a phase adjusting layer, and reference numeral 904 denotes a GaAs absorption layer.

In the present exemplary embodiment, here, a GaAs contact layer having a thickness of 20 nm and an $Al_{0.9}Ga_{0.1}As$ low refractive index layer having a thickness of 27 nm are used in the phase adjusting layer 902. The phase adjusting layer 902 is set to have a thickness just corresponding to an optical thickness of ¼ wavelength.

The light having the oscillation wavelength of 680 nm is also absorbed in the phase adjusting layer 902. However, in order to enable the absorption to be more surely caused, the GaAs absorption layer 904 having a thickness of 10 nm was arranged at the interface between the $Al_{0.5}Ga_{0.5}As$ high refractive index layer 120 having a thickness of 44 nm and the $Al_{0.9}Ga_{0.1}As$ low refractive index layer 118 having a thickness of 48 nm.

The interface corresponds to the interface 610 from the high refractive index layer to the low refractive index layer illustrated in FIG. 6.

Therefore, it is configured such that the total thickness of 44 nm of the thickness of the $Al_{0.5}Ga_{0.5}As$ high refractive index layer 120, and 5 nm of the thickness which is half the thickness of the GaAs absorption layer 902 having the thickness of 10 nm, corresponds to the optical thickness of ¼ wavelength, while the total thickness of 5 nm of the thickness which is the remaining half of the thickness of the GaAs absorption layer 902, and 48 nm of the thickness of the $Al_{0.9}Ga_{0.1}As$ low refractive index layer 118, corresponds to the optical thickness of ¼ wavelength.

The position of the node at which the GaAs absorption layer 902 is provided becomes, as shown in FIG. 6, an antinode in the light intensity distribution obtained in the reflection spectrum measurement in the low reflection region. Thereby, a sufficient absorption is caused so that the measurement of the dip wavelength can be performed.

By using the structure according to the present exemplary embodiment, it is possible to estimate the amount of the loss introduced by the method as described in exemplary embodiment 1, so that an element having excellent uniformity and reproducibility can be formed.

Exemplary Embodiment 3

As exemplary embodiment 3, there will be described a vertical cavity surface emitting laser which includes a concave surface relief structure and which oscillates at a wavelength of 980 nm.

Figure 13:
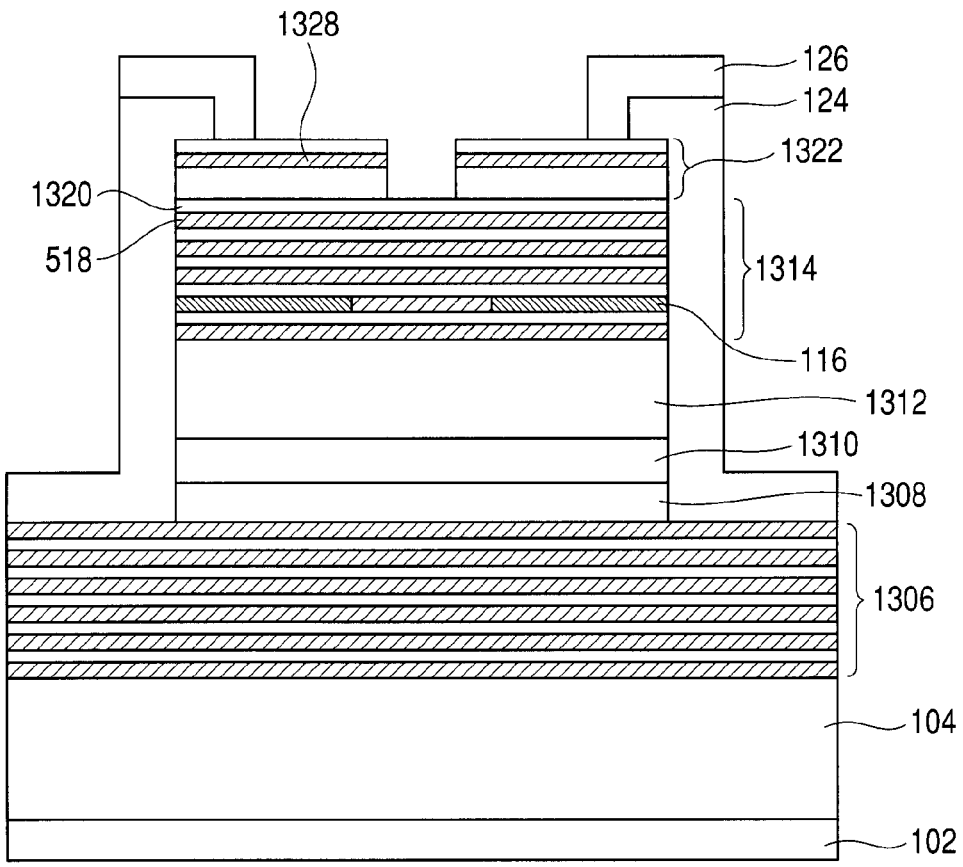
FIG. 13 is a cross-sectional schematic view for describing a vertical cavity surface emitting laser including a concave surface relief structure in exemplary embodiment 3 according to the present invention 3, and a manufacturing method of the vertical cavity surface emitting laser.

FIG. 13 is a cross-sectional schematic view for describing a configuration example of a vertical cavity surface emitting laser in the present exemplary embodiment.

In FIG. 13, the same portions as those illustrated in FIG. 1 are denoted by the same reference numerals. Thus, the description of the same portions is omitted, and only different portions are described.

In FIG. 13, reference numeral 1306 denotes an n-type $Al_{0.9}Ga_{0.1}As/GaAs$ multilayer film reflection mirror, reference numeral 1308 denotes an n-type AlGaAs spacer layer, and reference numeral 1310 denotes an InGaAs quantum well active layer. Reference numeral 1312 denotes a p-type AlGaAs spacer layer, reference numeral 1314 denotes a p-type $Al_{0.9}Ga_{0.1}As/GaAs$ multilayer film reflection mirror, and reference numeral 1320 denotes a p-type GaAs high refractive index layer. Further, reference numeral 1322 denotes a phase adjusting layer in which there are used here a GaAs layer and an $In_{0.3}Ga_{0.7}As$ layer 1328 for absorption.

In the present exemplary embodiment, the active layer 1310 has a multiple quantum well structure configured by a plurality of $In_{0.2}Ga_{0.8}As$ quantum well layers and GaAs barrier layers.

The layer thickness of the n-type AlGaAs spacer layer 1308 and the p-type AlGaAs spacer layer 1312 is adjusted so as to allow the multiple quantum well to be located at an antinode of the internal light standing wave.

As a resonator configured by these layers, the thickness of the layers is adjusted so as to have an optical thickness of an integer multiple of the oscillation wavelength of 980 nm. The active layer is adjusted and manufactured so that the wavelength of light emitted from the active layer itself has a light emission peak wavelength in the range of 960 to 970 nm.

The phase adjusting layer 1322, whose total layer thickness is set to 80 nm that corresponds to an optical thickness of ¼ wavelength, is configured by successively providing, from the outermost surface, a GaAs layer having a thickness of 20 nm, an $In_{0.3}Ga_{0.7}As$ having a thickness of 5 nm, and a GaAs layer having a thickness of 55 nm.

The phase adjusting layer 1322 also serves as the contact layer and hence is highly doped at $5 \times 10^{19}$ cm$^{-3}$ or more. Here, the $In_{0.3}Ga_{0.7}As$ layer having the above described arrangement and layer thickness serves as an band-to-band absorption layer for the light emission wavelength of 980 nm, so that the dip wavelength due to the phase adjusting layer can be clearly observed in the reflection spectra.

By using the above described structure according to the present exemplary embodiment, it is possible to estimate the amount of the loss introduced by the method as described in exemplary embodiment 1, so that an element having high uniformity and reproducibility can be formed.

Exemplary Embodiment 4

As exemplary embodiment 4, there will be described a configuration example of an optical apparatus configured by applying the vertical cavity surface emitting laser according to the present invention.

Figure 12A:
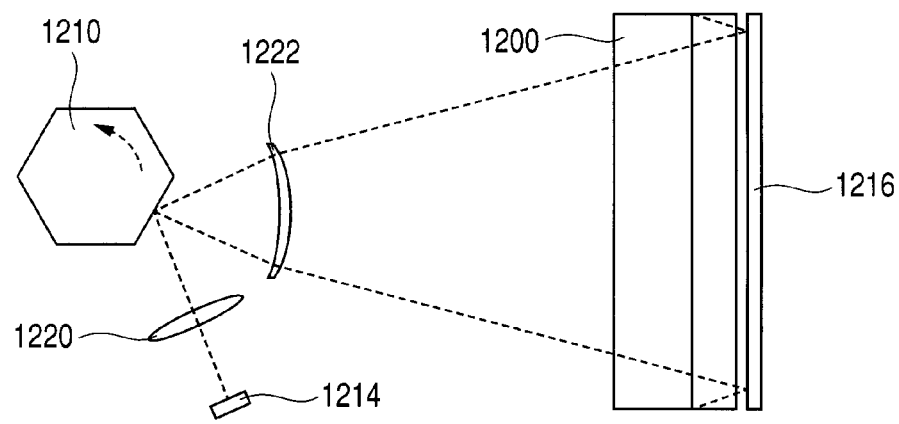
FIGS. 12A and 12B are schematic views for describing an image forming apparatus in exemplary embodiment 4 according to the present invention.
Figure 12B:
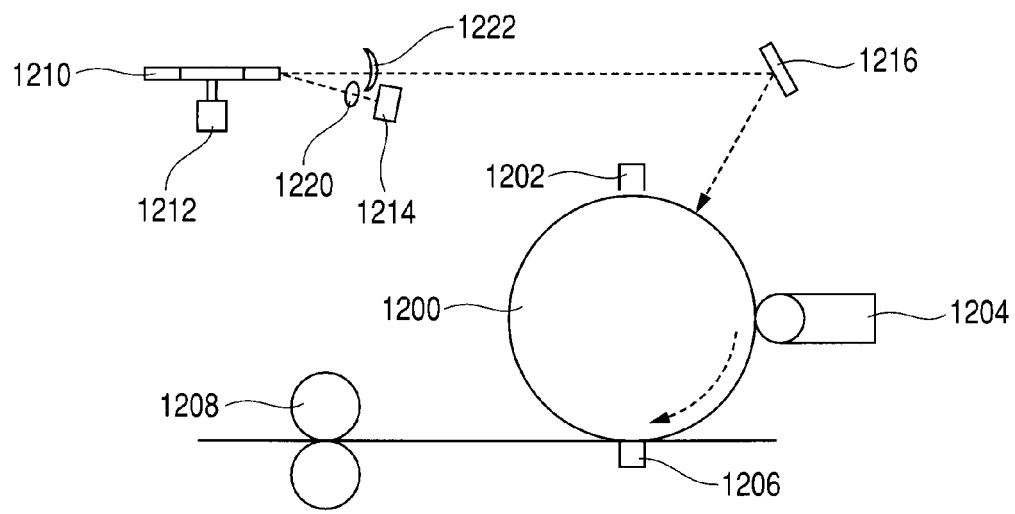

Here, there is described a configuration example of an image forming apparatus configured by using as an optical apparatus the red surface emitting laser array using the vertical cavity surface emitting lasers according to the present invention. FIGS. 12A and 12B are figures illustrating a configuration of an electrophotographic recording type image forming apparatus in which a laser array using the red surface emitting lasers according to the present exemplary embodiment is mounted.

FIG. 12A is a top view of the image forming apparatus, and FIG. 12B is a side view of the image forming apparatus. In FIGS. 12A and 12B, reference numeral 1200 denotes a photoreceptor, reference numeral 1202 denotes a charger, reference numeral 1204 denotes a developing device, reference numeral 1206 denotes a transfer charger, reference numeral 1208 denotes a fixing device, reference numeral 1210 denotes a rotary polygon mirror, and reference numeral 1212 denotes a motor. Further, reference numeral 1214 denotes a red surface emitting laser array, reference numeral 1216 denotes a reflection mirror, reference numeral 1220 denotes a collimator lens, and reference numeral 1222 denotes an f-θ lens.

The image forming apparatus according to the present exemplary embodiment is configured such that light beams from the light source configured by applying the vertical cavity surface emitting lasers according to the present invention are made incident on the photoreceptor so as to form an image.

Specifically, the motor 1212 illustrated in FIGS. 12A and 12B is configured so as to rotationally drive the rotary polygon mirror 1210.

Further, the rotary polygon mirror 1210 in the present exemplary embodiment includes six reflection surfaces. Reference numeral 1214 denotes the red surface emitting laser array serving as a light source for recording.

The red surface emitting laser array 1214 is turned on and off by a laser driver (not illustrated) according to an image signal. The laser light beam modulated in this way is irradiated from the red surface emitting laser array 1214 toward the rotary polygon mirror 1210 via the collimator lens 1220.

The rotary polygon mirror 1210 is rotated in the arrow direction. The laser light beams output from the red surface emitting laser array 1214 are reflected to be deflected beams whose emission angle is continuously changed by the reflection surface of the rotary polygon mirror 1210 according to the rotation of the rotary polygon mirror 1210.

The reflected light beams are subjected to distortion aberration correction, and the like, by the f-θ lens 1222, and are then irradiated onto the photoreceptor 1200 through the reflection mirror 1216, so as to be scanned in the main scanning direction on the photoreceptor 1200.

At this time, images of a plurality of lines corresponding to the red surface emitting laser array 1214 are formed in the main scanning direction of the photoreceptor 1200 by the light beams reflected by one reflection surface of the rotary polygon mirror 1210.

In the present exemplary embodiment, a 4×8 red surface emitting laser array 1214 is used, and hence images of 32 lines are simultaneously formed.

The photoreceptor 1200 is charged beforehand by the charger 1202, and is successively exposed by the scanning of the laser light beam, so that an electrostatic latent image is formed.

Further, the photoreceptor 1200 is rotated in the arrow direction, and the formed electrostatic latent image is developed by the developing device 1204. The developed visible image is transferred onto a transfer paper (not shown) by the transfer charger 1206.

The transfer paper with the visible image transferred thereon is conveyed to the fixing device 1208, so as to be fixed, and is then discharged outside the image forming apparatus.

Further, in the present example, the 4×8 red surface emitting laser array is used, but the red surface emitting laser array is not limited to this. An m×n red surface emitting laser array (where m and n are natural numbers) may be used.

As described above, when the red surface emitting laser array according to the present exemplary embodiment is used in an electrophotographic recording type image forming apparatus, it is possible to obtain an image forming apparatus which enables high speed and highly precise printing.

Note that in the above description, there is described an example in which an image forming apparatus is configured as an optical apparatus, but the present invention is not limited to such configuration.

For example, an optical apparatus, such as a projection display, may also be configured such that a light source configured by applying the vertical cavity surface emitting laser according to the present invention is used, and that the light beam from the light source is made incident on an image display body so as to display an image.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2008-199000, filed Jul. 31, 2008, which is hereby incorporated by reference herein in its entirety.

What is claimed is:

1. A surface emitting laser which is configured by laminating on a substrate a lower reflection mirror, an active layer, and an upper reflection mirror,
   which includes, in a light emitting section of the upper reflection mirror, a structure for controlling reflectance that is configured by a low reflectance region and a concave high reflectance region formed in the central portion of the low reflectance region, and which oscillates at a wavelength of $\lambda$, wherein
   the upper reflection mirror is configured by a multilayer film reflection mirror based on a laminated structure formed by laminating a plurality of layers,
   the multilayer film reflection mirror includes a phase adjusting layer which has an optical thickness in the range of $\lambda/8$ to $3\lambda/8$ in a light emitting peripheral portion on the multilayer film reflection mirror, and
   an absorption layer causing band-to-band absorption is provided on a surface side from a layer laminated at the middle point in thickness of the laminated structure that configures the multilayer film reflection mirror,
   wherein the absorption layer is provided within five pairs of layers from the surface side of the laminated structure.

2. The surface emitting laser according to claim 1, wherein the absorption coefficient of the absorption layer is 5000 cm-1 or more for the wavelength $\lambda$.

3. The surface emitting laser according to claim 1, wherein the absorption layer is arranged so that when seen from the surface side of the multilayer film reflection mirror, a part of the absorption layer is included in the interface from a high refractive index layer to a low refractive index layer in the multilayer film reflection mirror.

4. An optical apparatus comprising, as a light source, a surface emitting laser array configured by arranging a plurality of the surface emitting lasers according to claim 1.

5. A surface emitting laser which is configured by laminating on a substrate a lower reflection mirror, an active layer, and an upper reflection mirror,
   which includes, in a light emitting section of the upper reflection mirror, a structure for controlling reflectance that is configured by a low reflectance region and a concave high reflectance region formed in the central portion of the low reflectance region, and which oscillates at a wavelength of $\lambda$, wherein
   the upper reflection mirror is configured by a multilayer film reflection mirror based on a laminated structure formed by laminating a plurality of layers,
   the multilayer film reflection mirror includes a phase adjusting layer which has an optical thickness in the range of $\lambda/8$ to $3\lambda/8$ in a light emitting peripheral portion on the multilayer film reflection mirror, and
   an absorption layer having an absorption coefficient of 5000 cm-1 or more for the wavelength $\lambda$ is provided on the surface side from a layer laminated at the middle point in thickness of the laminated structure that configures the multilayer film reflection mirror,
   wherein the absorption layer is provided within five pairs of layers from the surface side of the laminated structure.

* * * * *